United States Patent
Covic

(10) Patent No.: US 9,966,797 B2
(45) Date of Patent: May 8, 2018

(54) INTEROPERABILITY OF MAGNETIC STRUCTURES FOR INDUCTIVE POWER TRANSFER SYSTEMS

(75) Inventor: Grant Anthony Covic, Mt. Albert (NZ)

(73) Assignee: Auckland UniServies Ltd., Auckland (NZ)

( * ) Notice: Subject to any disclaimer, the term of this patent is extended or adjusted under 35 U.S.C. 154(b) by 806 days.

(21) Appl. No.: 14/131,138

(22) PCT Filed: Jul. 9, 2012

(86) PCT No.: PCT/NZ2012/000121
§ 371 (c)(1),
(2), (4) Date: Apr. 11, 2014

(87) PCT Pub. No.: WO2013/019122
PCT Pub. Date: Feb. 7, 2013

(65) Prior Publication Data
US 2014/0239729 A1    Aug. 28, 2014

(30) Foreign Application Priority Data

| Jul. 8, 2011 | (NZ) | ......................................... | 593977 |
| Sep. 16, 2011 | (NZ) | ......................................... | 595251 |
| Dec. 23, 2011 | (NZ) | ......................................... | 597367 |

(51) Int. Cl.
*H01F 27/42*  (2006.01)
*H01F 37/00*  (2006.01)
(Continued)

(52) U.S. Cl.
CPC .............. *H02J 50/12* (2016.02); *B60L 11/182* (2013.01); *B60L 11/1829* (2013.01);
(Continued)

(58) Field of Classification Search
CPC ........ G01R 31/28; G01R 31/26; G01R 31/00; B60L 11/182; H02J 5/005; H02J 5/00;
(Continued)

(56) References Cited

U.S. PATENT DOCUMENTS

| 3,703,692 A * | 11/1972 | Peschel | ................ | G01R 31/021 |
| | | | | 336/134 |
| 6,277,251 B1 * | 8/2001 | Hwang | ............ | H01J 37/32504 |
| | | | | 204/192.13 |

(Continued)

FOREIGN PATENT DOCUMENTS

| EP | 0552738 | 7/1993 |
| EP | 0650240 | 4/1995 |
| WO | WO-2010/090539 | 8/2010 |

OTHER PUBLICATIONS

International Application No. PCT/NZ2012/000121, International Search Report and Written Opinion dated Nov. 28, 2012, (dated Nov. 28, 2012), 13 pgs.

*Primary Examiner* — Fritz M Fleming
*Assistant Examiner* — Jagdeep Dhillon
(74) *Attorney, Agent, or Firm* — Schwegman Lundberg & Woessner, P.A.

(57) ABSTRACT

Inductive power transfer apparatus has a first magnetic coupling structure and a second magnetic coupling structure, the structures being adapted to generate and/or receive magnetic flux to thereby transfer power inductively, the first structure comprising a substantially circular coil, and the second magnetic structure comprising an arrangement of at least two coils associated with a magnetically permeable core.

18 Claims, 23 Drawing Sheets

(51) Int. Cl.
*H01F 38/00* (2006.01)
*H02J 50/12* (2016.01)
*G01R 31/28* (2006.01)
*H02J 50/70* (2016.01)
*H02M 7/00* (2006.01)
*H01F 38/14* (2006.01)
*H02J 17/00* (2006.01)
*B60L 11/18* (2006.01)
*H02J 5/00* (2016.01)

(52) U.S. Cl.
CPC .......... *B60L 11/1833* (2013.01); *G01R 31/28* (2013.01); *H01F 38/14* (2013.01); *H02J 17/00* (2013.01); *H02J 50/70* (2016.02); *H02M 7/003* (2013.01); *H02J 5/005* (2013.01); *Y02T 10/7005* (2013.01); *Y02T 10/7072* (2013.01); *Y02T 90/12* (2013.01); *Y02T 90/121* (2013.01); *Y02T 90/122* (2013.01); *Y02T 90/125* (2013.01); *Y02T 90/127* (2013.01); *Y02T 90/14* (2013.01)

(58) Field of Classification Search
CPC ... H02J 7/025; H02J 7/00; H02J 17/00; Y02T 10/7072; Y02T 90/122; H01F 38/14; H01F 27/28; H01F 21/064; H05H 1/40; H05H 1/00
USPC ....... 307/104, 149, 9.1, 10.1, 66, 64, 80, 82; 320/108, 109, 103; 455/41.1, 41.2, 41.3; 336/131, 134, 223; 427/571, 572, 570; 324/158.1
See application file for complete search history.

(56) References Cited

U.S. PATENT DOCUMENTS

| | | | | |
|---|---|---|---|---|
| 7,042,196 B2* | 5/2006 | Ka-Lai | .................. | H01F 38/14 320/108 |
| 7,151,366 B2* | 12/2006 | Renken | ............ | H01L 21/67253 324/750.02 |
| 2001/0050267 A1* | 12/2001 | Hwang | ................ | H01J 37/321 216/67 |
| 2003/0058078 A1* | 3/2003 | Busletta | ................ | H01F 38/14 336/223 |
| 2004/0085174 A1* | 5/2004 | Decristofaro | ............ | H01F 3/14 336/178 |
| 2005/0116683 A1* | 6/2005 | Cheng | ...................... | H01F 3/02 320/108 |
| 2006/0061323 A1* | 3/2006 | Cheng | .................... | H02J 5/005 320/108 |
| 2009/0085701 A1* | 4/2009 | Veneruso | .............. | E21B 47/122 336/92 |
| 2010/0136262 A1* | 6/2010 | Godyak | ................... | H01J 37/321 427/571 |
| 2010/0285747 A1* | 11/2010 | Bauer | .................... | H01F 38/14 455/41.1 |
| 2012/0025603 A1* | 2/2012 | Boys | .................... | B60L 11/182 307/9.1 |
| 2015/0170833 A1* | 6/2015 | Widmer | .................. | H01F 38/14 307/104 |

* cited by examiner $h_z \propto P_L/2$

| Bipolar Pad construction | Ferrite volume comparison | | | No. of turns | Overlaps (figure 11) (mm) |
|---|---|---|---|---|---|
| | | $V_F$ (mm$^3$) | $V_F$ (cm$^3$) | | |
| Bipolar with Bar ferrites |  | 374976 | 374.976 | 5 turns (bifilar) | 13 |
| Ferrite grid & large coils (P1) |  | 343200 | 343.2 | 5 turns (bifilar) | 9 |
| Ferrite grid Coils Smaller (P1 – CS) |  | 343200 | 343.2 | 5 turns (bifilar) | -6 |
| Smaller Ferrite grid & large coils P2 |  | 211200 | 211.2 | 5 turns (bifilar) | 18 |

# INTEROPERABILITY OF MAGNETIC STRUCTURES FOR INDUCTIVE POWER TRANSFER SYSTEMS

PRIORITY CLAIM TO RELATED APPLICATIONS

This application is a national stage application under 35 U.S.C. § 371 of PCT/NZ2012/000121, filed Jul. 9, 2012, and published as WO 2013/019122 A1 on Feb. 7, 2013, which claims priority to New Zealand Application No. 593977, filed Jul. 8, 2011, and claims priority to New Zealand Application No. 595251, filed Sep. 16, 2011, and claims priority to New Zealand Application No. 597367, filed Dec. 23, 2011, which applications and publication are incorporated by reference as if reproduced herein and made a part hereof in their entirety, and the benefit of priority of each of which is claimed herein.

FIELD OF THE INVENTION

This invention relates to inductive power transfer (IPT), and has relevance to the magnetic structures, commonly referred to as couplers or pads, that generate and receive magnetic flux for the purposes of transferring power in a contactless manner.

BACKGROUND

IPT systems provide galvanic and physical isolation to enable safe operation in wet or dirty environments and consequently the systems are reliable and maintenance free. These hallmarks along with convenience have resulted in a large range of applications for IPT systems, such as powering consumer electronics, Automatic Guided Vehicles and electric vehicles (EVs). Power transfer levels of typical systems vary from 0.5 W to 50 kW with air gaps between couplers of 1-150 mm. IPT is an ideal method for recharging EVs because no user intervention is required. Concrete or asphalt may be laid over the ground based coupling structure making it extremely durable and vandal resistant unlike any other system that uses moving parts. Contactless charging for EVs is normally achieved inductively through mutual coupling between coils, as in a transformer, however the coupling coefficient (k) is typically in the order of 0.01-0.5 due to inherently large air gaps.

IPT systems may be loosely grouped as either distributed or lumped topologies; the former is suited to applications where continuous power is required and the latter for cases where power only needs to be transferred at a fixed position. A distributed system comprises a primary coil laid out in an elongated loop (forming a track) and one or more secondary coils that couple to a small portion of the track providing power to loads. A lumped system is based on discrete primary and secondary coils and power can only be transferred when the coils are closely aligned and have sufficient mutual coupling. These systems may be further broken down into either closely coupled or loosely coupled types. Closely coupled systems operate with relatively small air gaps and the user typically has to 'plug in' the primary. One example of a closely coupled system is "charge paddles" which were proposed for early electric vehicles. Loosely coupled systems operate with a large air gap and do not require user intervention; these systems are the subject of this specification. The exemplary embodiments are provided in the context of recharging EVs and the loosely coupled lumped topology is considered the most suitable given vehicles are typically parked in known fixed locations, for example, parking lots, taxi ranks and garages. Those skilled in the art to which the invention relates will appreciate that the invention will have relevance to other IPT applications. In this document the magnetic coupling structures are referred to as couplers or power pads. The fundamental flux paths produced by these typically determines the overall cost and feasibility of any IPT system.

EV manufacturers consider power levels of 2-7 kW with an operational air gap of 100-250 mm practical, and thus coupler designs capable of supplying 7 kW over a 125 mm air gap are considered essential for cars. In addition, the system needs to transfer full power with sufficient horizontal tolerance (typically more than 100 mm). For Roadway Powered Electric Vehicles (RPEVs) even larger zones are desirable at higher power levels and greater separations. Due to the potential for large scale deployment of both stationary charging and RPEV applications, power pads that can work in both applications are desirable. They also need to be as electrically efficient, and cost efficient, as possible with the absolute minimum of material use. These requirements make EV charging a demanding application for IPT.

A typical lumped IPT system comprises three main components, a power supply, power couplers (often in the form of pads) and a Pick-Up (PU) controller as shown in FIG. 1. The power supply produces a sinusoidal current in the VLF frequency range; it is typically 20 kHz for the examples referred to herein. This causes resonance between the inductive Transmitter (Tx.) pad ($L_1$) and its impedance matched parallel compensation capacitor ($C_1$). This approach allows the reactive current ($I_1$) in $L_1$ to create a relatively high flux density in the vicinity of the transmitter pad thereby boosting power transfer for given switch ratings. A typical IPT PU frontend consists of a parallel resonant tank comprising $L_2$ and $C_2$, and a switched mode controller. The voltage across the tank is rectified and a switched mode controller enables it to operate at a defined quality factor (Q) to boost power transfer and provide a usable DC output. Parallel compensation is commonly used in battery charging applications due to its current limiting characteristic. Tuning effectively boosts the resonant voltage across the load ($QV_{oc}$) to match the battery voltage, while the load current is fixed by the short circuit current of the Receiver (Rx.) pad. The IPT system will only be able to supply the required power if the current out of the receiver pad is sufficient within the desired tolerance range. In practice, the turns ratio is adjusted to achieve this. For the example discussed above, the "transmitter" pad is likened to a primary winding and the "receiver" pad structure which is connected to, or forms part of, the PU is likened to a secondary winding. However, the invention may also be applicable to bi-directional systems i.e. systems in which the direction of power flow may be reversed.

The power output of an IPT system ($P_{out}$) is quantified by the open circuit voltage ($V_{oc}$) and short circuit current ($I_{sc}$) of the PU pad as well as the quality factor as shown in (1). This can also be written in terms of the VA at the input terminals of the transmitter pad ($V_{in}I_1$), the transformer coupling coefficient (k) and the operating Q of the receiver circuit as shown.

$$P_{out} = P_{su}Q = V_{oc}I_{sc}Q = \omega I_1^2 \frac{M^2}{L_2} Q = V_{in}I_2 k^2 Q \qquad (1)$$

The coupling coefficient provides a useful measure for directly comparing the magnetic properties of different pad topologies and can be easily determined by taking a few measurements with an LCR meter. The operating Q of the PU can be temporarily ignored to decouple the magnetic design and the output power; this is then related to the transmitter driving VA and $k^2$. In practice the input voltage to the supply is limited (e.g. 240V) placing a constraint on the maximum transmitter VA. Consequently, the output power is highly dependent on k and designs that have maximal k at a given air gap are preferable. At present EV manufacturers are concentrating on small urban vehicles and these typically have very low ground clearances so that the required air gap between couplers can be as small as 125 mm. A 3D Finite Element Method (FEM) software package called JMAG is used to model power pads driven with a constant current source. There is an implicit increase in the driving VA as inductances vary with pad movement or parameter changes such as the coil diameter. In practice, this increase in VA can be realized by adding series capacitance to the Tx. pad to effectively lower the inductance seen by the supply however the amount that can be practically added is limited because it also increases the tuning sensitivity. The peaks in $P_{su}$ and k do not usually occur at the same design point. As a result, selecting a pad design that meets the performance requirements (7 kVA in the examples referred to in this specification) typically requires a compromise in coupling and driving the pad inductance.

Couplers that are based on circular designs are by far the most common coupler topology used in EV charging. A known circular pad construction is shown in FIG. 2, and is described in our published international patent application WO2008/24033, the contents of which are incorporated herein by reference. Inductively coupled chargers commonly use two power pads that are circular in shape and may have dimensions of 400 mm diameter by 25 mm thick for example.

However, to use an inductive charger such as this the vehicle must be positioned relatively accurately over the charging pad—typically within 50 mm of perfect alignment—and the separation (i.e. the vertical clearance) between the power pad on the vehicle and the power pad on the ground must be closely controlled. In principle, inductive power transfer may be accomplished for vertical spacings between 0 mm and 100 mm but if the system is set up for 100 mm it will have quite a large reduction in power at 120 mm and may well be inoperable below 50 mm. This state of affairs occurs because both the self inductance and the mutual inductance of the power pads vary widely as the distance between the pads changes. Thus at 100 mm the power pad receiver or pick-up may have a pick-up voltage of 100 V and a short circuit current of 5.0 A for a power rating of 500 W. If the IPT system electronics operates with a Q factor of 4, then 2 kW can be transferred to the battery though there are still difficulties to overcome in producing the power needed at the appropriate battery voltage.

The known power pad construction of FIG. 2 comprises an aluminium case 1 containing typically eight ferrite bars 2 and a coil 3. Current in the coil causes magnetic flux in the ferrite bars and this flux has flux lines that start on the ferrite bars and propagate to the other end of the bar in a path containing the coil that may be thought of as a semi-elliptical shape. The flux lines 4 for a single bar are shown in FIG. 3. The flux lines leave the ferrite in an upward direction and propagate to the other end of the bar, entering it at right angles. No flux goes out the back of the pad as the solid aluminium backing plate 1 prevents it. In the actual pad the eight bars give a flux pattern shown approximately in cross section in FIG. 3A. A simulation of the actual flux pattern is shown in FIG. 3B.

From FIG. 3B it can be seen that at the highest point the flux lines are essentially horizontal. Therefore, to get the maximum separation possible between the primary pad and the secondary pad it would be advantageous to detect this horizontal flux. However, the horizontal flux is still relatively close to the pad (extending from the pad approximately one quarter of the diameter of the pad) and there is no horizontal flux at all at the very centre of the power pad. Thus at the very point where maximum flux density would be ideal—the centre—the actual usable horizontal flux component is zero. References in this document to a circular pad or coupler refer to a coupler having a coil arrangement (which is not necessarily a true circle) that when energised directs flux in a manner similar to that shown in FIG. 3B. That is to say there is little or no horizontal flux along an axis from the centre of a flux generating circular coupler in a direction toward an intended receiver coupler.

The induced voltage in the pick-up pad (i.e. the vehicle mounted power pad) is very separation sensitive—corresponding to the variation in mutual inductance—so that at 120 mm it is reduced by approximately 40% while at 50 mm it is increased by a factor of 2. A reduction in power means that the vehicle does not get fully charged in the usual time, but the more challenging situation is that at smaller separations the power transferred may be so high that the components of the circuit are overloaded. Also, as the separation is reduced the self inductance of the pick-up coil also changes so that the circuit operates off-frequency putting extra stress on the power supply. As the separation gets smaller still this stress on the power supply caused by the non-tuned pick-up on the primary side cannot be sustained and the system must be shut down. In practice it is feasible to operate with a separation between 40 and 100 mm but a larger range is too difficult.

A range of separation from 40 to 100 mm is quite small. If the vehicle has a relatively high ground clearance then either the power pad on the vehicle has to be lowered or the power pad on the ground has to be raised. Automatic systems for doing this compromise the reliability of the charging system. Alternatively the pad on the ground can be on a fixed but raised platform but such a pad is a tripping hazard when a car is not being charged and this situation is generally to be avoided in a garage or other location involving vehicles and pedestrians.

OBJECT

It is an object of the invention to provide a flux transmission or reception apparatus that overcomes or ameliorates one or more disadvantages of the prior art, or which will at least provide the public with a useful choice.

SUMMARY OF THE INVENTION

In one aspect the invention broadly provides inductive power transfer apparatus comprising a first magnetic coupling structure and a second magnetic coupling structure, the structures being adapted to generate and/or receive magnetic flux to thereby transfer power inductively, the first structure comprising a substantially circular coil, and the second magnetic structure comprising an arrangement of at least two coils associated with a magnetically permeable core.

Preferably the coils of the second magnetic structure are arranged to provide coupling tolerance to relative transverse movement between the first and second structures.

Preferably the coils of the second structure extract electrical energy from the magnetic field produced by the first structure in differing amounts as the relative transverse position of the structures differs.

Preferably one of the coils of the second structure receives a greater proportion of a first directional component of a magnetic field produced by the first structure, and another of the coils of the second structure receives a greater proportion of a second directional component of the magnetic field produced by the first structure.

Apparatus as claimed in claim 4 wherein the components are orthogonal to each other.

Preferably one component is a vertical component of magnetic flux and the other component is a horizontal component.

Preferably the components are in quadrature.

Preferably the coils of the second structure are flat coils.

Preferably the coil of the first structure is a flat coil.

Preferably two coils of the second structure are in a side by side relationship.

Preferably the second structure includes a third coil arranged in spatial quadrature with the at least two coils.

Preferably the second structure includes two coils which overlap each other.

Preferably the core of the second structure has regions of greater and lesser magnetic reluctance.

Preferably the core of the second structure comprises a lattice.

In another aspect the invention broadly provides an inductive power transfer system including the apparatus of one of the preceding statements.

In another aspect the invention broadly provides inductive power transfer apparatus comprising a first magnetic coupling structure and a second magnetic coupling structure, the structures being adapted to generate and/or receive magnetic flux to thereby transfer power inductively, the first structure comprising a substantially circular coil, and the second magnetic structure comprising an arrangement of at least two coils, the at least two coils being located in substantially the same plane.

Preferably the at least two coils of the second structure are adjacent to each other.

Preferably the at least two coils of the second structure are in a side by side relationship.

Alternatively the at least two coils overlap each other.

Preferably the second structure includes a third coil arranged in spatial quadrature with the at least two coils.

Preferably the coils of both structures comprise substantially flat coils.

In another aspect the invention broadly provides inductive power transfer apparatus comprising a first magnetic coupling structure and a second magnetic coupling structure, the structures being adapted to generate and/or receive magnetic flux to thereby transfer power inductively, the first structure comprising two coils arranged substantially adjacent to each other and in substantially the same plane, and the second magnetic structure comprising an arrangement of at least three coils, two coils being located in substantially the same plane and adjacent to each other, and a third coil arranged in spatial quadrature with the two coils.

Preferably the coils of both structures comprise substantially flat coils.

In another aspect the invention broadly provides an IPT system including the apparatus of any one of the foregoing statements of invention.

In another aspect the invention provides a method of inductive power transfer, the method comprising the steps of generating a magnetic flux using a first structure having a substantially circular coil, and receiving the magnetic flux from the first structure using a second structure having at least two coils, the at least two coils being located in substantially the same plane.

In another aspect the invention provides a method of inductive power transfer, the method comprising the steps of generating a magnetic flux using a first structure comprising two coils arranged substantially adjacent to each other and in substantially the same plane, and receiving the magnetic flux from the first structure using a second structure comprising an arrangement of at least three coils, two coils being located in substantially the same plane and adjacent to each other, and a third coil arranged in spatial quadrature with the two coils.

In another aspect the invention broadly provides inductive power transfer magnetic coupling apparatus comprising a lattice structure of a magnetically permeable material.

Preferably the lattice structure comprises a plurality of linked bars of magnetically permeable material.

Preferably the structure comprises a plurality of elongate bars and a plurality of connecting members which connect the bars to provide a lattice structure.

Preferably the bars are substantially parallel.

Preferably the bars are arranged in a longitudinal direction and the connecting members interconnect the bars in a transverse direction.

Preferably the interconnecting members are spaced to provide flux paths in a plurality of directions through the structure.

Preferably the structure comprises ferrite.

In a further aspect the invention provides an IPT flux pad or coupler comprising one or more energisable coils associated with a magnetically permeable core having a lattice structure.

Preferably the coil(s) are located on one side of the core.

Preferably the core comprises a plurality of elongate bars and a plurality of connecting members which connect the bars to provide a lattice structure.

In another aspect the invention broadly provides inductive power transfer apparatus comprising a first magnetic coupling structure and a second magnetic coupling structure, the structures being adapted to generate and/or receive magnetic flux to thereby transfer power inductively, the first structure comprising a substantially circular coil, and the second magnetic structure comprising an arrangement of two or more coils, at least one of the coils being wound around a magnetically permeable core.

Preferably the two or more coils of the second structure are both wound around the core.

In one embodiment at least one of the coils of the second magnetic structure comprises a plurality of part-coils.

In one embodiment one of the coils of the second magnetic structure extracts energy from flux travelling in one direction through the core, and another of the coils of the second magnetic structure extracts energy from flux travelling in a different direction through the core.

In one embodiment the one of the coils of the second magnetic structure extracts energy from flux travelling in a direction at right angles to the direction of the flux travelling in the other coil.

In one embodiment one of the coils of the second magnetic structure comprises a substantially flat coil. In another embodiment a plurality of flat coils are provided in magnetic association with the second magnetic structure.

Further aspects of the invention will become apparent from the following description.

DRAWING DESCRIPTION

Figure 16A:
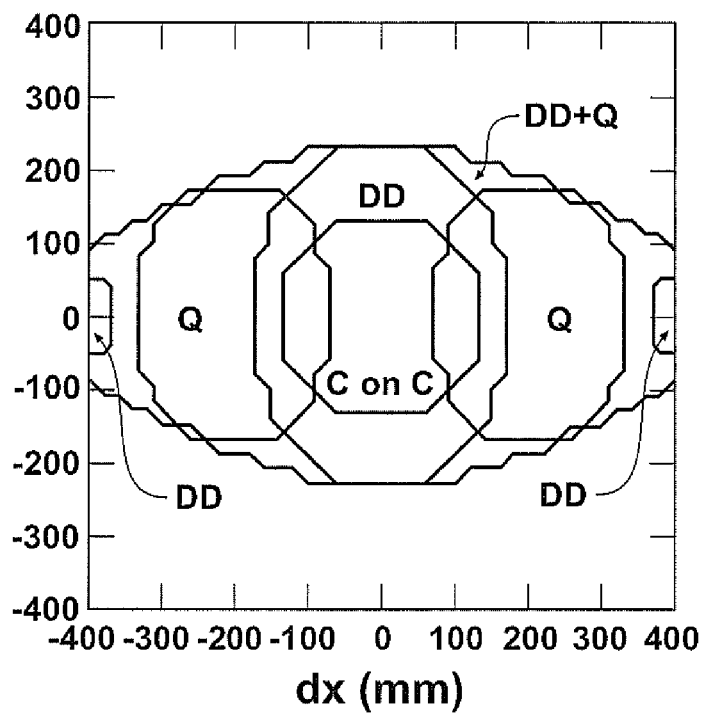
FIG. 16 illustrates 7 kW charge zones for different pad combinations ($Q_{max}$=6) (a) circular on circular and DDQ on DD, and (b) circular on circular and DDQ on circular ($I_1$=23 A at 20 kHz)
Figure 22:
Figure 22:
Figure 22:
Figure 22:
Figure 23A:
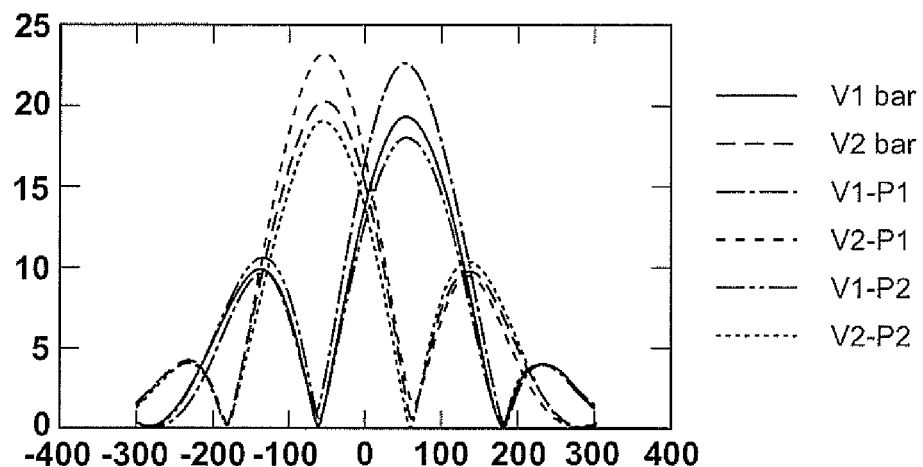
Figure 23B:
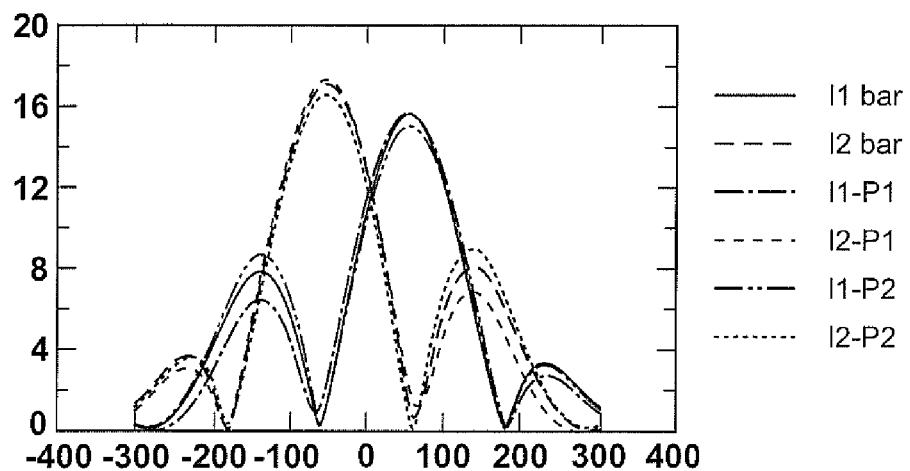
Figure 23C:
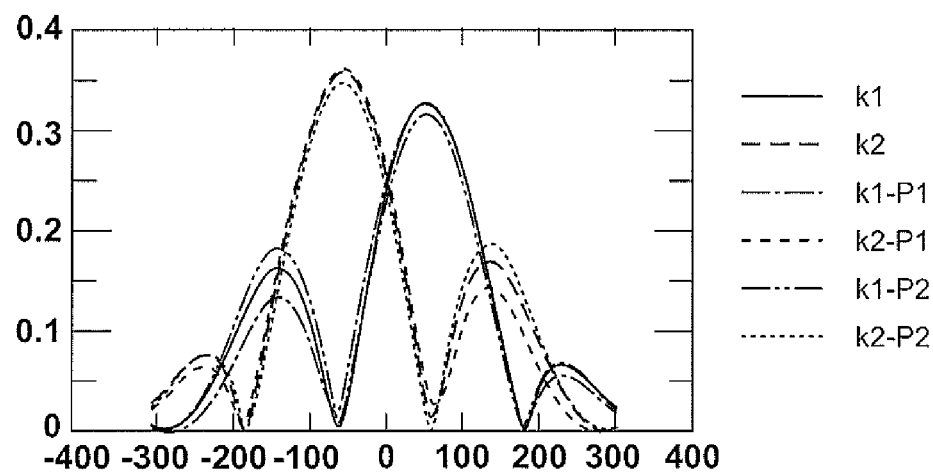
Figure 23D:
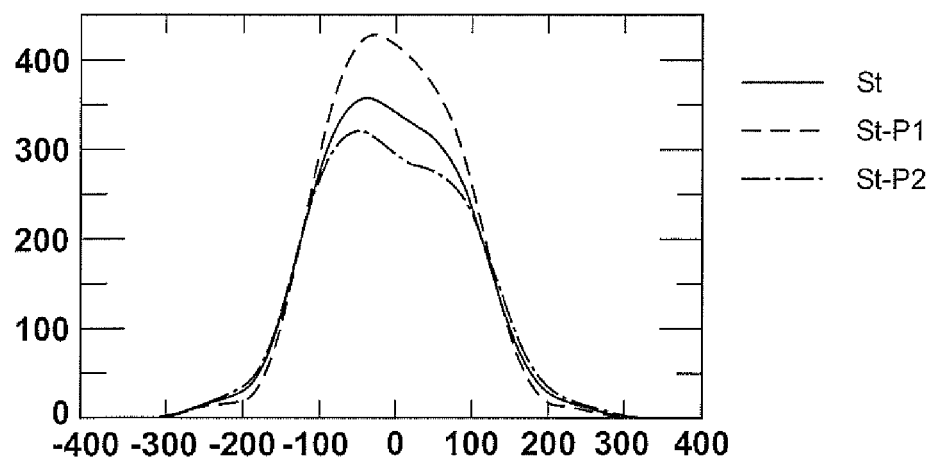
Figure 24A:
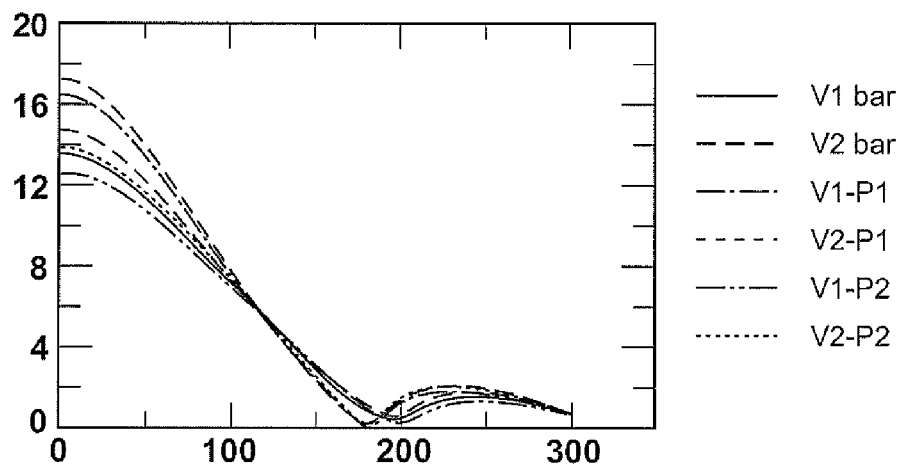
Figure 24B:
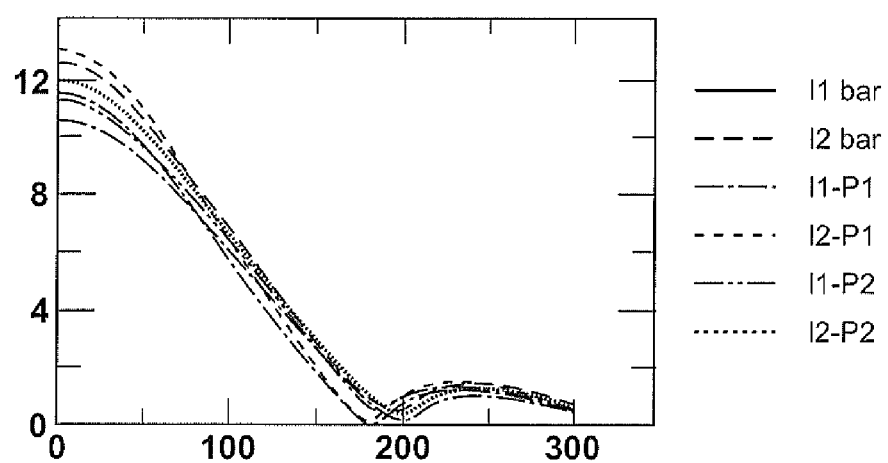
Figure 24C:
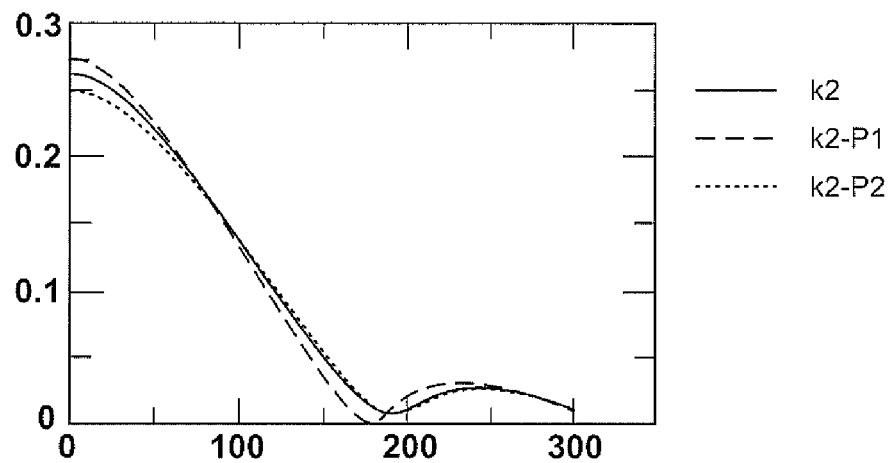
Figure 24D:
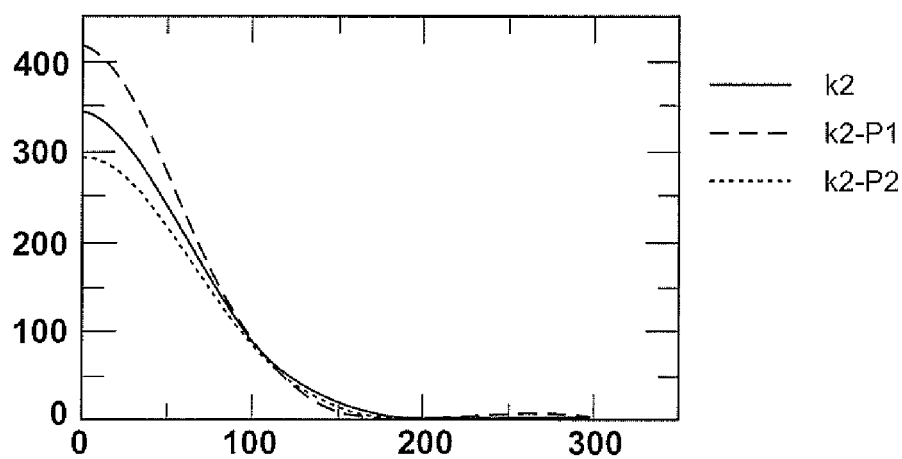
Figure 25A:
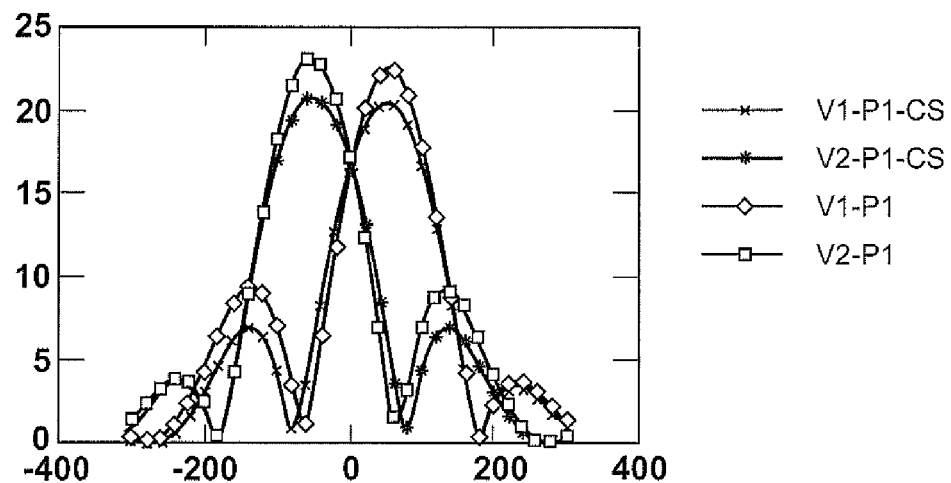
Figure 25B:
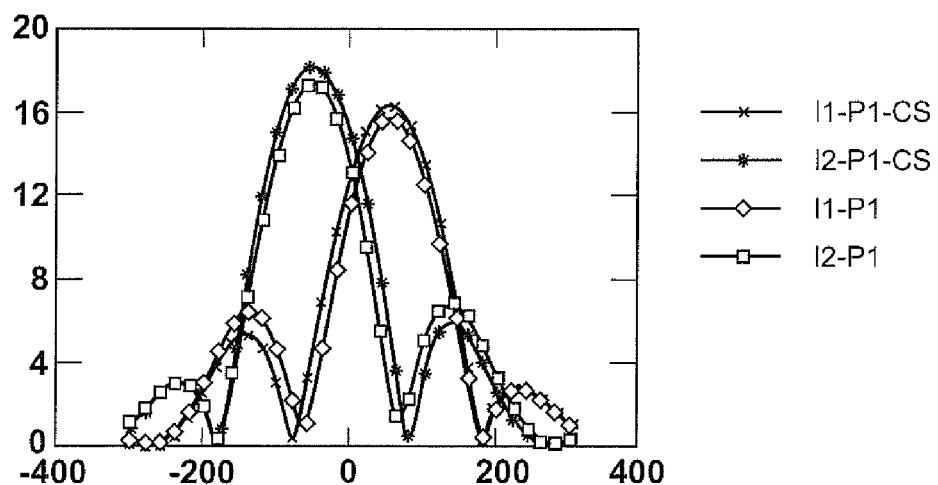
Figure 25C:
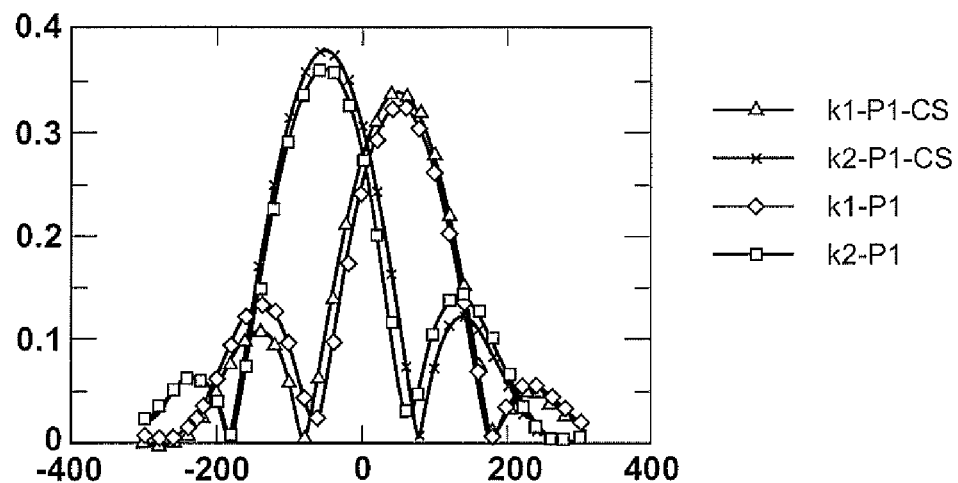
Figure 25D:
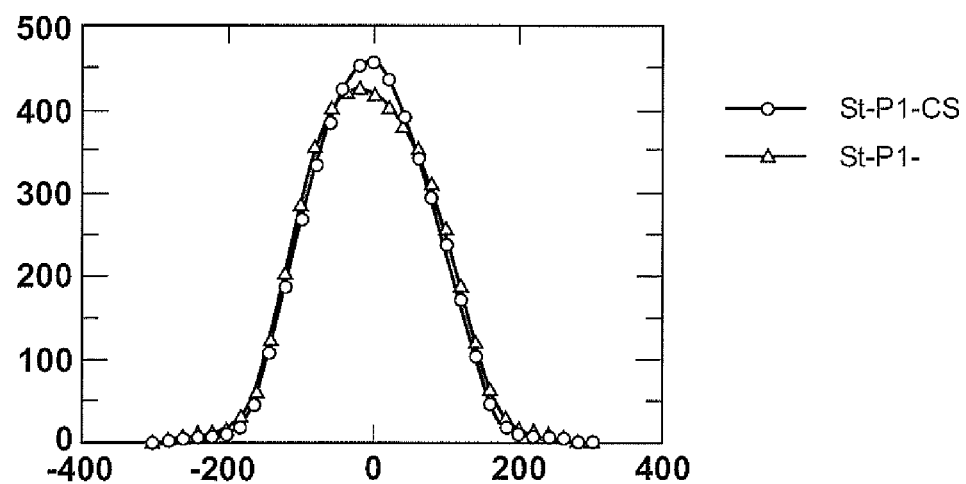
Figure 26A:
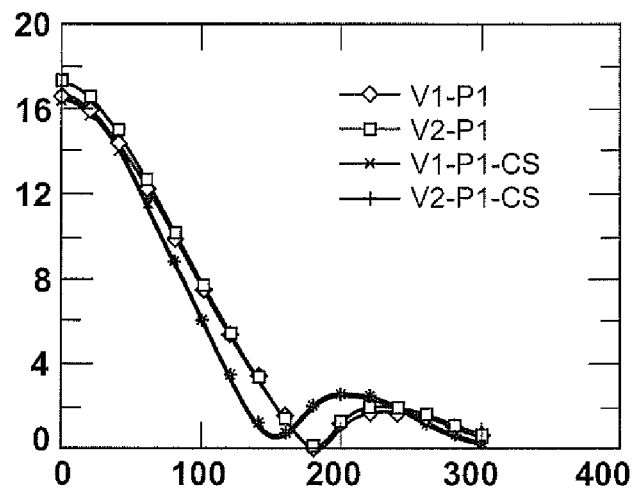
Figure 26B:
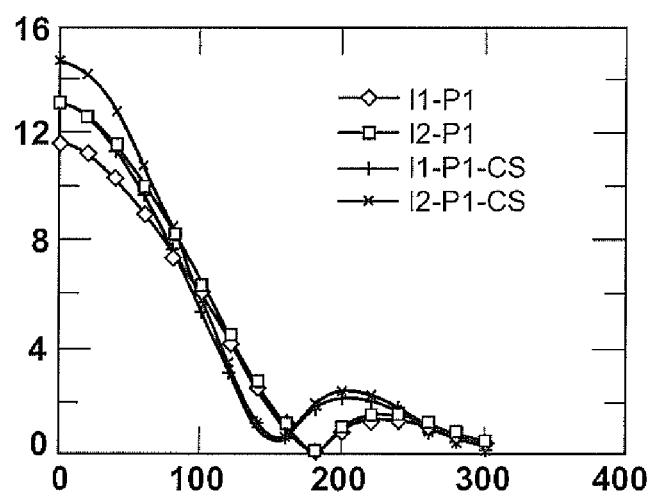
Figure 26C:
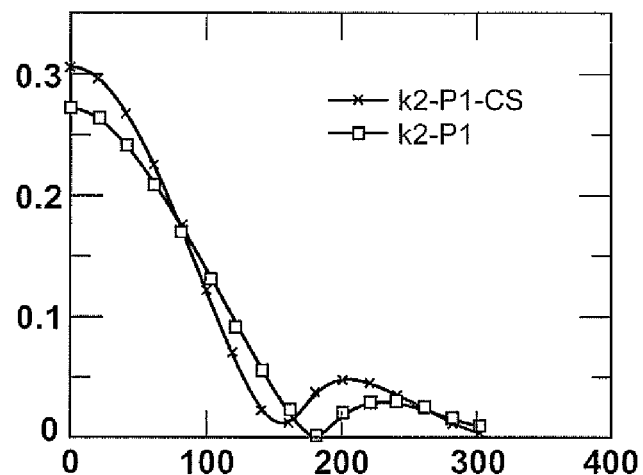
Figure 26D:
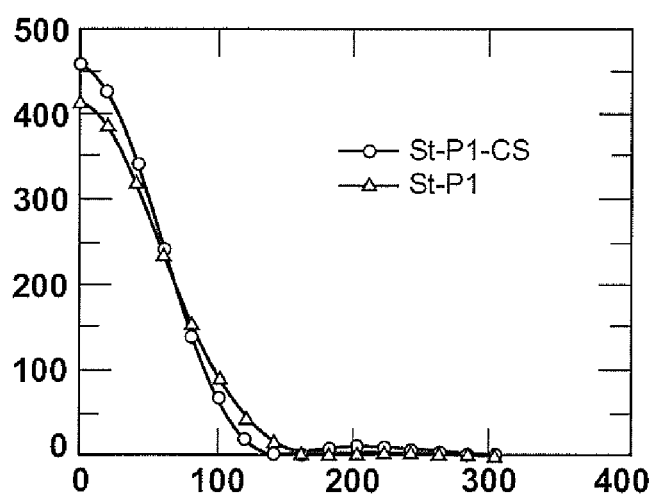
Figure 27:
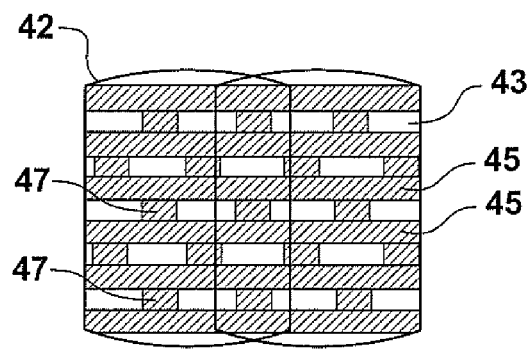
Figure 28:
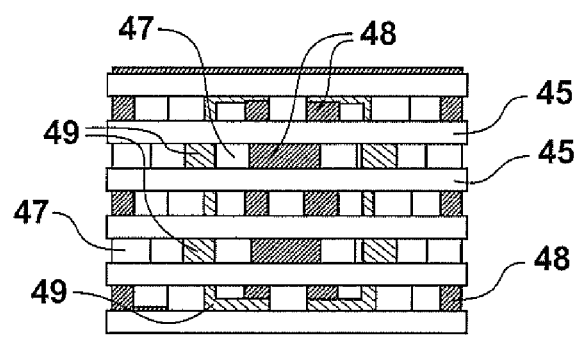

FIG. 22 shows four bipolar pad constructions using different ferrite back planes FIGS. 23(a)-(d) show voltage, current coupling factor and total uncompensated VA profiles respectively for x-displacements between a primary circular pad and various bipolar pad constructions of FIG. 16 with similar coil sizes FIG. 24 (a)-(d) shows voltage, current coupling factor and total uncompensated VA profiles respectively for y-displacements between a primary circular pad and various bipolar pad constructions of FIG. 16 with similar coil sizes FIG. 25 (a)-(d) shows voltage, current coupling factor and total uncompensated VA profiles respectively for x-displacements between a primary circular pad and two bipolar pad constructions having identical ferrite structure but varying coil size FIG. 26 (a)-(d) shows voltage, current coupling factor and total uncompensated VA profiles respectively for y-displacements between a primary circular pad and two bipolar pad constructions having identical ferrite structure but varying coil size FIG. 27 shows a plan view from below of a bipolar flux receiver having a core or back plane in the form of a lattice FIG. 28 shows a plan view from above of a DDQ flux receiver having a core or back plane in the form of a lattice

DESCRIPTION OF ONE OR MORE EMBODIMENTS

Where appropriate throughout the description like reference numerals are used to refer to like features present in the various embodiments.

Figure 1:
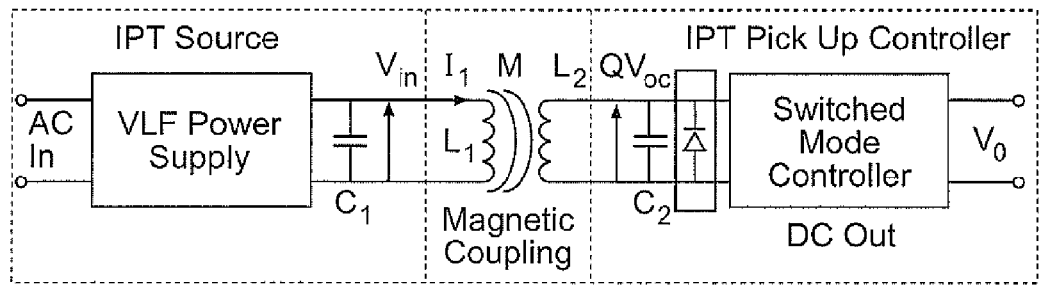
FIG. 1 is a basic circuit diagram illustrating components of an IPT system.
Figure 2:
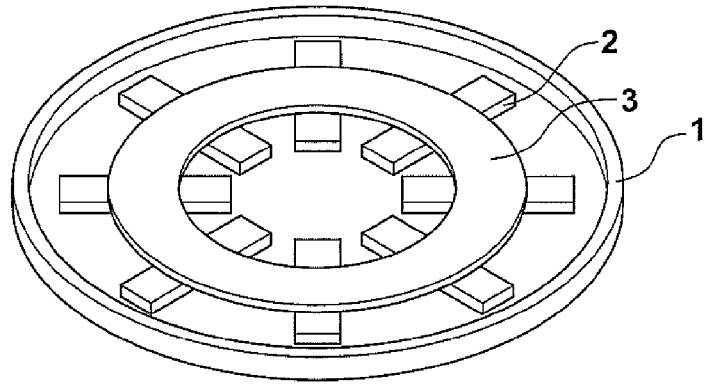
FIG. 2 is a perspective view of part of a known form of IPT power transfer pad.
Figure 3:
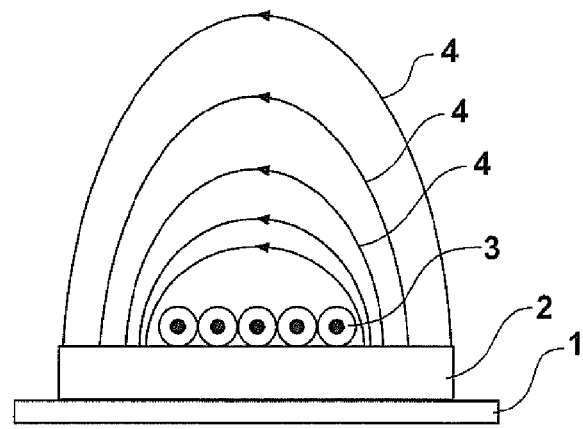
FIG. 3 is a diagrammatic elevation in cross section of a part of the pad of FIG. 2 showing flux lines.
Figure 3A:
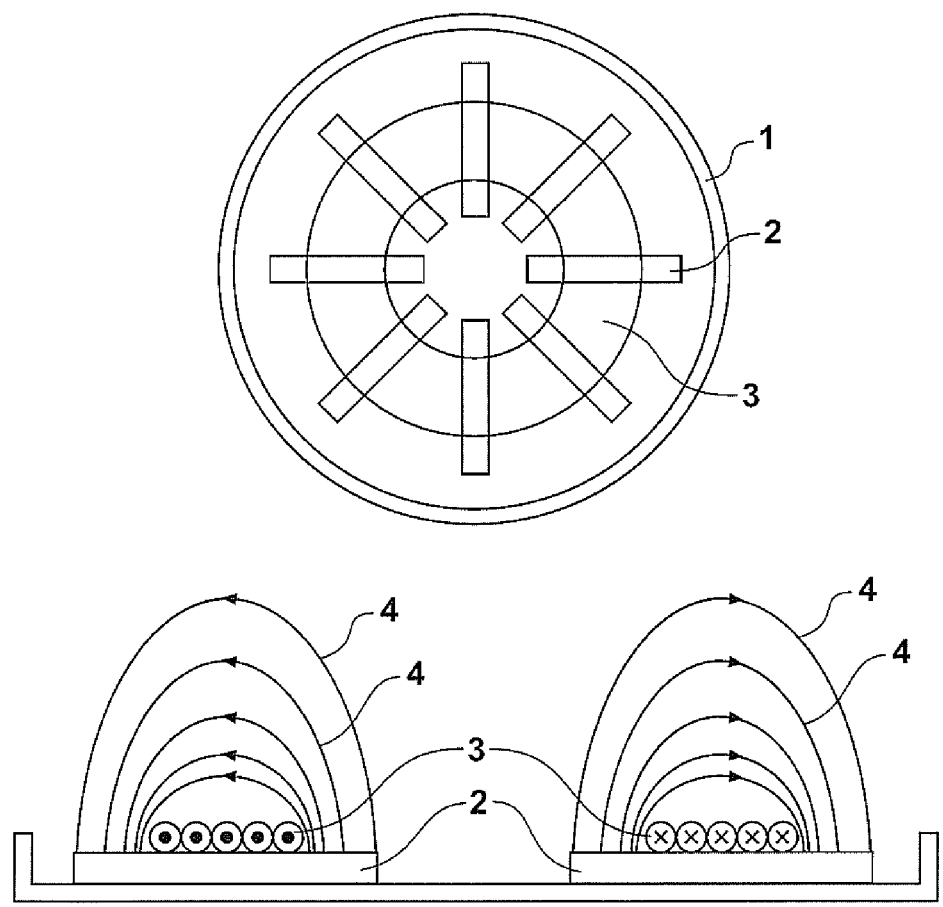
FIG. 3A is a plan view and elevation of a cross section of the pad of FIG. 2 showing flux lines.
Figure 3B:
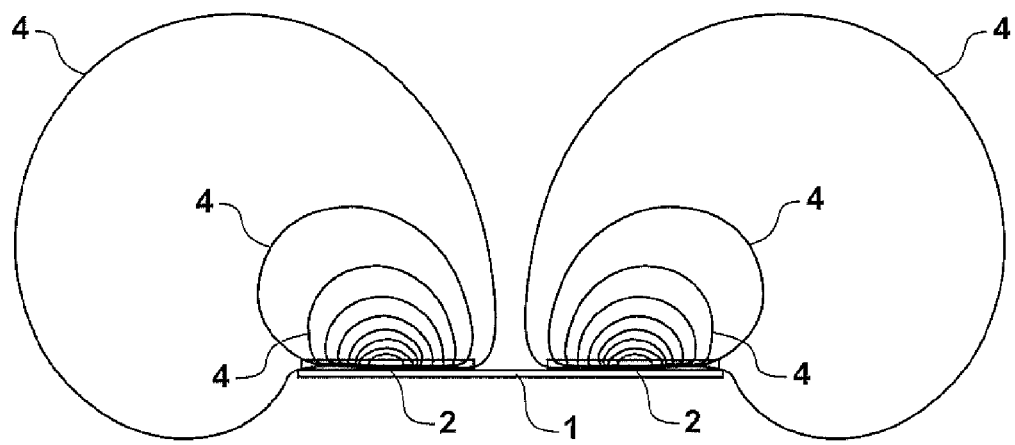
FIG. 3B is an elevation in cross section of a computer generated simulation of the magnetic field (indicated by flux lines) of the pad of FIG. 2.
Figure 4:
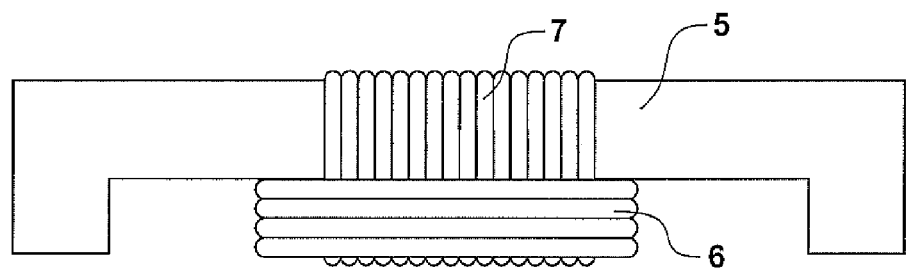
FIG. 4 is an elevation in partial cross section of a first embodiment of an IPT system flux transmitter and receiver arrangement including a pad such as that shown in FIG. 2.
Figure 4:
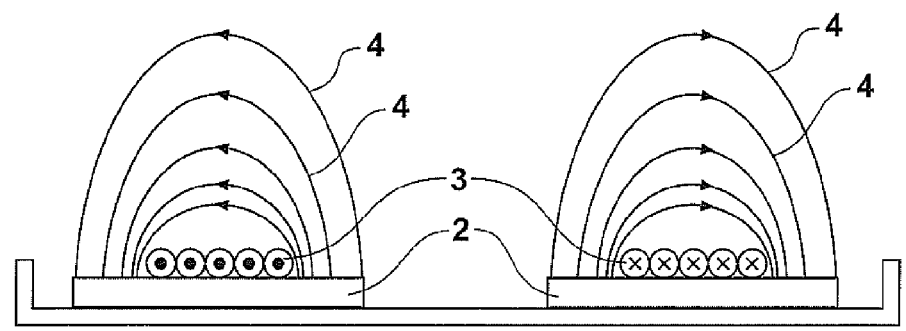

A first embodiment of a new interoperable arrangement of magnetic structures for an IPT system is shown in FIG. 4. Referring to that Figure, the system includes a circular transmitter structure and a receiver comprising a core 5 having an E-shaped cross-section (preferably constructed of magnetically-permeable ferrite or a material having similar desirable magnetic properties). The core 5 comprises three substantially parallel vertical legs and orthogonal connection regions connecting adjacent legs to each other. A core of this geometry may be referred to as a Flat E Core.

The core 5 is provided with a first coil 6 wound around a vertical axis (the central leg of the core 5) and a second coil 3 wound around a horizontal axis of the core. The pick-up is shown positioned so that the coil arrangement is situated near the centre of the circular transmitter coil 3. The current flowing in the coil 3 produces anticlockwise and clockwise magnetic fields on opposite sides of the transmitter pad as shown in FIG. 4. As can be seen from FIG. 4, when the receiver structure is centered on the transmitter the magnetic flux travelling through the central leg of core 5 induces a current in the coil 6. If the receiver structure is moved sideways as shown in FIG. 4 (i.e. off-centre), which will result in less flux flowing through the central leg, more flux will flow through the horizontal axis of the core 5 and this flux induces a current in coil 7. Therefore, this arrangement, in which there are a plurality coils wound around the receiver core to ensure that electrical energy is extracted from variations in flux due to relative changes in position between the receiver core and a circular transmitter, allows a pick-up to extract power over a wider range of movement i.e. the system provides greater coupling tolerance to relative transverse movement between the coupling structures. Accordingly the system has greater tolerance to misalignment.

Figure 5:
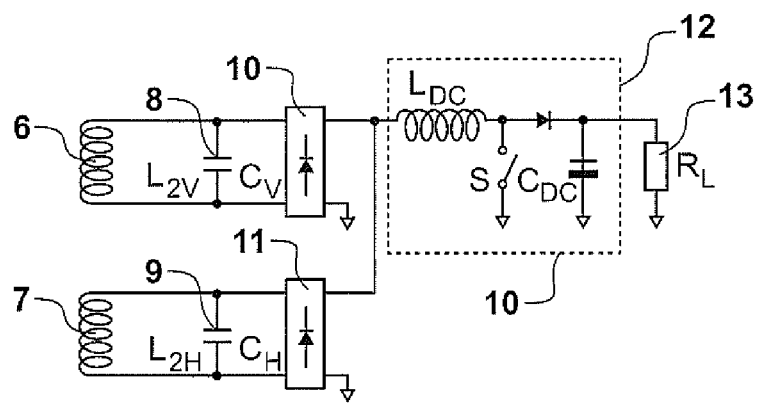
FIG. 5 is a simplified circuit diagram of a pick-up control circuit for use with the arrangement of FIG. 4.

FIG. 5 shows a possible tuning and power control circuit for the pick-up configuration of FIG. 4, including independent tuning capacitors 8 and 9, and rectifiers 10 and 11 for the coils 6 and 7, respectively. A regulating circuit generally referenced 12 operates in the known way, decoupling the pick-up from the primary coil 3 to supply a constant voltage to the load 13. This control strategy is described in greater detail in U.S. Pat. No. 5,293,308, the contents of which are incorporated herein by reference.

Series tuning capacitors may also be provided if required for each coil 6, 7 to ensure that the effective short circuit current and open circuit voltage outputs of both the first and second coils can be matched, thereby ensuring a power profile that is as even as possible.

Figure 6:
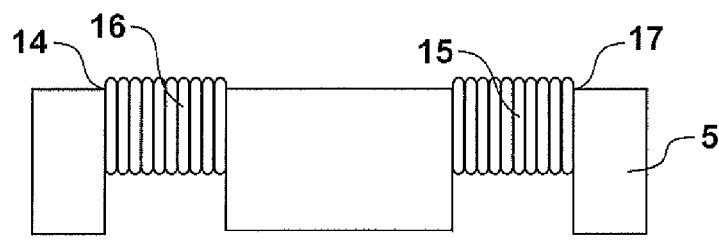
FIG. 6 is an elevation of a second embodiment of an IPT system flux transmitter and receiver arrangement including a pad such as that shown in FIG. 2.
Figure 7:
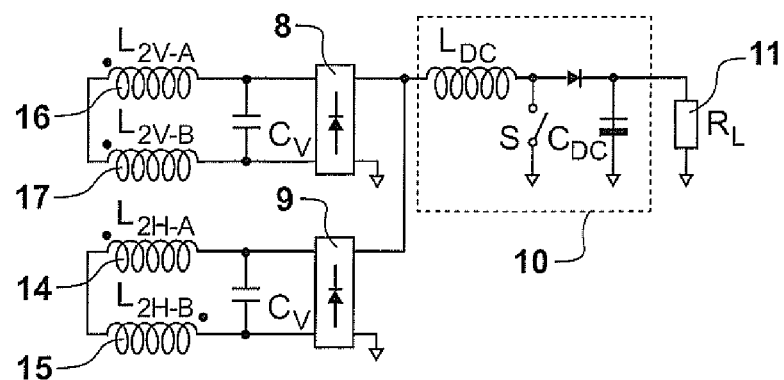
FIG. 7 is a simplified circuit diagram of a pick-up control circuit for use with the arrangement of FIG. 6.

FIG. 6 shows a second embodiment of the receiver apparatus for a pick-up according to the invention, in which the two coils 6 and 7 of FIG. 4 each comprise a set of part-coils (in this embodiment half-coils), 14 and 15, and 16 and 17. In this configuration, the vertically directed magnetic flux from the circular coil 3 of the transmitter pad flows through the central leg of the E core and splits through the connection portions of the core which are provided either side of the central leg and connect the central leg to the remaining two legs of the core. As can be seen, axes of the connecting portions are orthogonal to axes of the legs of core 5 and the part-coils are provided on the connection portions of core 5 in this embodiment. Coils 16 and 17 extract energy from the flux that flows into the central leg of the core 5 and splits through the connecting portions, so coils 16 and 17 are arranged as shown in FIG. 7 to sum the induced current which will be in a different direction in each coil. Coils 12 and 13 extract energy from the flux that flows horizontally in one direction through the core 5, so those coils are arranged to sum the induced currents. The associated tuning and power control circuit for this embodiment is shown in FIG. 7.

The tuning capacitors in FIG. 7 must all be individually chosen as they all correspond to different magnetic circuits. Again this wiring arrangement gives the same form of output as indicated in FIG. 5 and can be extended indefinitely by adding extra track circuits. Also, the E core may be extended by adding additional legs and connection portions, with further part-coils. Again, series tuning capacitors can be provided for the coil sets to match the outputs of the coil sets, and thus provide a power profile that is as even as possible.

As with the first embodiment, in the embodiment of FIGS. 6 and 7 the arrangement increases the useful range of lateral i.e. transverse movement for an IPT system using a circular pad structure while still achieving useful power outputs with little change or added cost to the electronic control circuitry.

Figure 8:
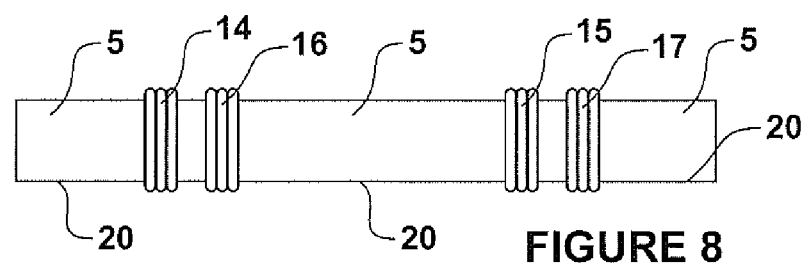
FIG. 8 is an elevation of a third embodiment of an IPT system flux transmitter and receiver arrangement including a pad such as that shown in FIG. 2.

Turning to FIG. 8, a further embodiment is shown in which the embodiment of FIGS. 6 and 7 now has the core 5 provided as a flat core structure rather than an E-core. The part-coils 14, 15 and 16, 17 are wound around the core so as to leave a pole areas 20 for receiving (or transmitting) magnetic flux. Operation of this embodiment is the same as described with reference to the embodiment of FIGS. 6 and 7.

Figure 9:
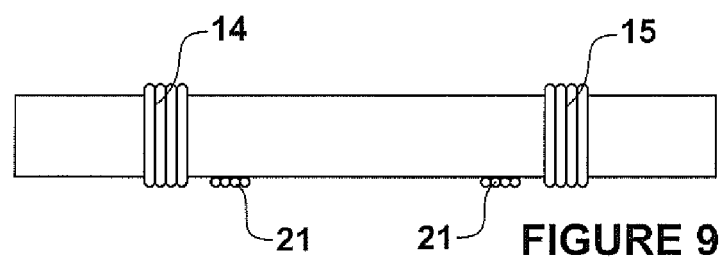
FIG. 9 is an elevation in partial cross section of a fourth embodiment of an IPT system flux transmitter and receiver arrangement including a pad such as that shown in FIG. 2.

Turning to FIG. 9, a further embodiment is shown in which the embodiment of FIGS. 6 and 7 now has a core 5 provided as a flat core structure rather than an E-core. The part-coils 14 and 15 are still present to capture flux that travels in one direction through the core and in this configuration they would be added in phase. An alternative embodiment is to have one larger single coil (a combination of 14 and 15). The part-coils 16 and 17 are replaced by a flat coil 21 which captures the flux entering the core 5 in the central part of the core behind the flat coil 21.

Figure 9B:
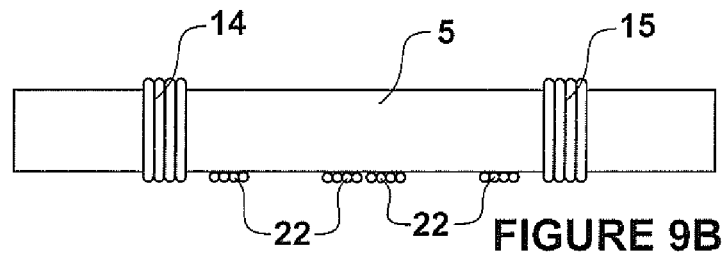
FIG. 9(b) is an elevation in partial cross section of a fifth embodiment of an IPT system flux transmitter and receiver arrangement including a pad such as that shown in FIG. 2.

Turning to FIG. 9b, a further embodiment is shown in which the embodiment of FIGS. 6 and 7 now has a core 5 provided as a flat core structure rather than an E-core. The part-coils 14 and 15 are still present to capture flux that travels in opposite directions through the core so in this configuration they would be added out of phase. The part-coils 16 and 17 are replaced by two flat coils 22 which are added out of phase.

Figure 10:
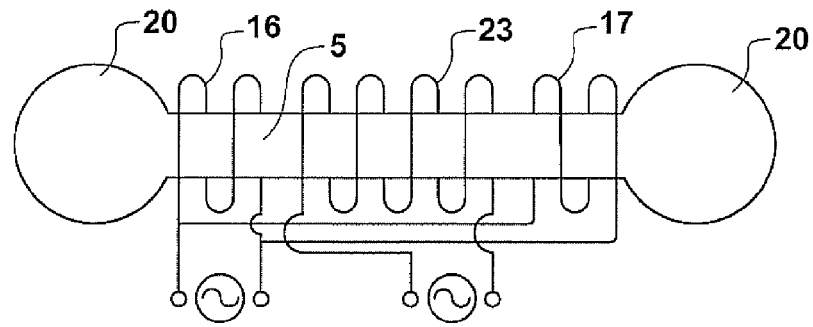
FIG. 10 is plan view of a sixth embodiment of an IPT system flux transmitter and receiver arrangement including a pad such as that shown in FIG. 2.

FIG. 10 shows a further embodiment of a receiver structure in which part-coils 14, 15 of the embodiment of FIGS. 7 and 8 are replaced by a single central coil 23. The electrical connection is also shown in FIG. 10. The part coils 16 and 17 are connected out of phase to produce a second coil to extract energy from fluxes travelling in the core in opposite directions.

Figure 11:
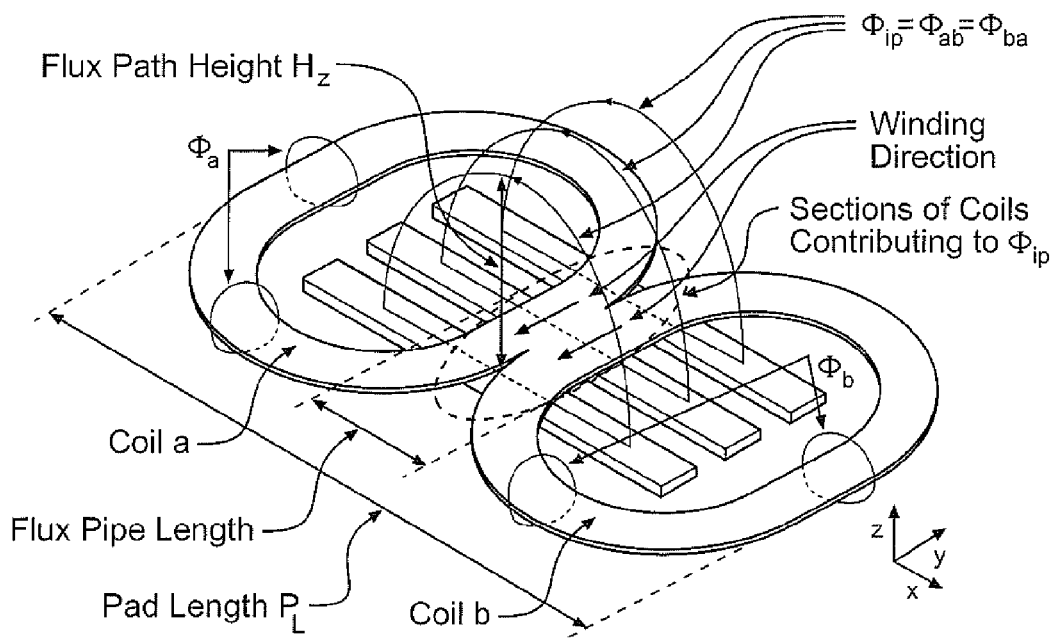
FIG. 11 is a simplified model of a DD pad with main flux components $\phi_a$, $\phi_b$ and $\phi_{ip}$, produced by coil a, b and mutual coupling respectively.

In another embodiment, a new pad topology eliminates unwanted rear flux paths by placing two coils above (rather than around) the ferrite strips as shown in FIG. 11. This form of pad is referred to in this document as a DD pad or structure as described in WO2010090539A1. The ferrite (being provided in the form of parallel bars in the embodiment shown thus providing regions of greater and lesser reluctance in the core to facilitate desired flux paths) channels the main flux behind the coils and forces the flux to radiate on one side, resulting in negligible loss. The ideal DD flux paths are shown in FIG. 11. These paths allow good coupling to a similar shaped receiver pad because the fundamental height is ($h_z$) is proportional to ½ of the pad length. A key feature to achieving a high coupling factor between two power pads is intra-pad coupling $k_{ip}$. The height of the intra-pad flux ($\phi_{ip}$) is controlled by adjusting the width of the coils in the shaded area of FIG. 11, to create a "flux pipe" between coil a and b. The fraction of flux $\phi_{ip}$) that couples to the receiver pad is mutual flux ($\phi_m$) therefore the section of coil forming the flux pipe should be made as long as possible. Conversely, the remaining length of the coil should be minimized to save copper and lower $R_{ac}$. Doing so results in coils shaped like a "D" and since there are two such coils placed back to back, the pad is referred to herein as a Double D (DD).

The result of an optimization process was a built pad measuring 770 mm×410 mm that uses four strips (as shown in FIG. 11) comprising 6×193 cores. The coils were made up of 20 turns of 6.36 mm² Litz wire wound with a pitch of 6.1 mm resulting in a flux pipe length of 240 mm (43% ferrite coverage).

Figure 12:
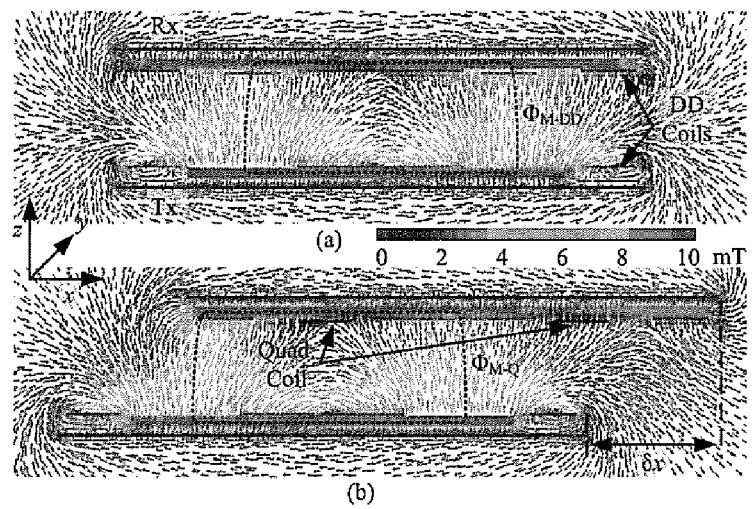
FIG. 12 shows magnetic flux density vectors in the xz plane of a DDQ-DD system (a) horizontally aligned and (b) misaligned by 190 mm.

DD receiver coils can only couple horizontal flux components. As such the tolerance of the receiver pad to horizontal offsets in the x direction can be significantly improved if a second receiver coil is added. This coil is designed to capture only vertical flux and is in spatial quadrature to the DD. The additional coil requires lengthened ferrite strips to enhance flux capture and the combined structure is referred to herein as a DDQ receiver. This form of receiver is described in WO2010090539. The flux plot of FIG. 12(a) shows there is no mutual flux between the DD transmitter and quadrature receiver coils when the pads are aligned ($\delta_z$ is 125 mm); the DD supplies the full output power. However, when the receiver is horizontally offset by 190 mm (as in the flux plot of FIG. 12(b)) the quadrature coil is ideally positioned to capture the field and able to supply the full output power, while the DD is nearing a null in its power profile (this occurs at $\delta_x$=240 mm).

Figure 13:
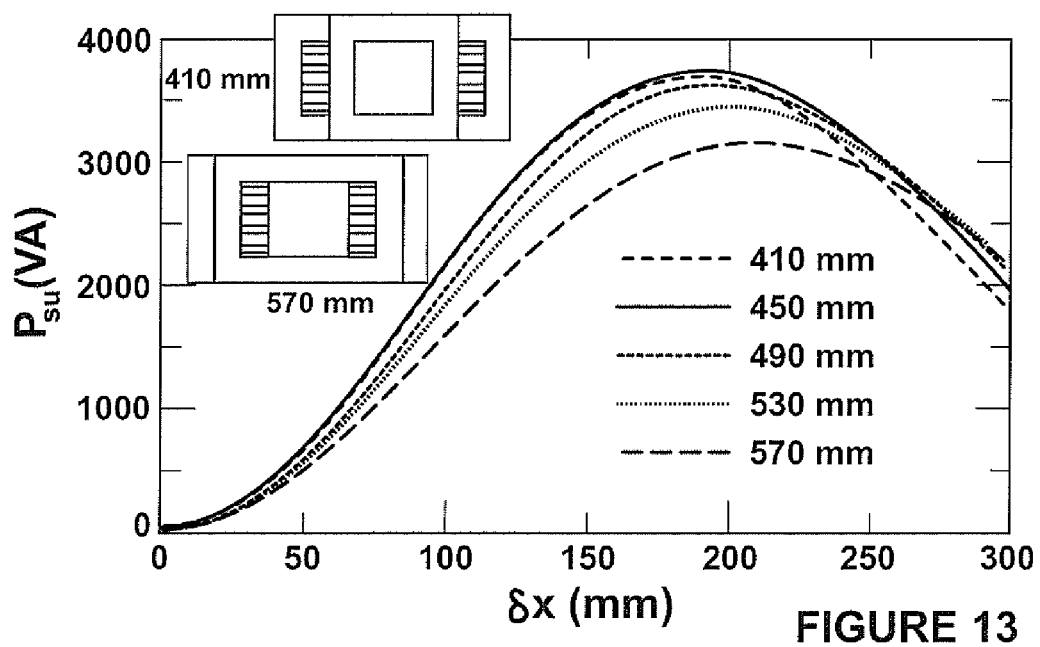
FIG. 13 shows power profiles for quadrature coils of various widths ($I_1$=23 A)

The DDQ receiver described in WO2010090539 had a quadrature coil which was built prior to any optimization, however it is has since been determined that a reduced coil width provides better performance. The optimization process involves taking power profiles in the x direction for quadrature coils of various widths. The profiles were done with a 125 mm air gap and the results are shown in FIG. 13, the insets show the coil width range given it has to fit within the DD coils. The highest $P_{su}$ is achieved with a 450 mm wide coil however a width of 410 mm was chosen given the $P_{su}$ is similar but there is an overall reduction in the length of Litz wire of 1.6 m.

The advantages of IPT charging are well recognized and there has been significant development of systems by academia and industry. At present circular pads are the most common even though they fundamentally offer poor performance and are not suitable for RPEV applications. Prior to conducting an interoperability investigation via simulation, an experimental measurement vs. simulation was undertaken to verify the models containing different pads were accurate (the original built 700 mm circular pad was used). The results were found to be in agreement so the diameter of the coil in the circular pad was adjusted to a $\delta_{A1}$ of 40 mm and the quadrature coil width was set to 410 mm. The three possible combinations referred to by 'receiver on transmitter' are: circular on circular, DDQ on circular and DDQ on DD.

Figure 17:
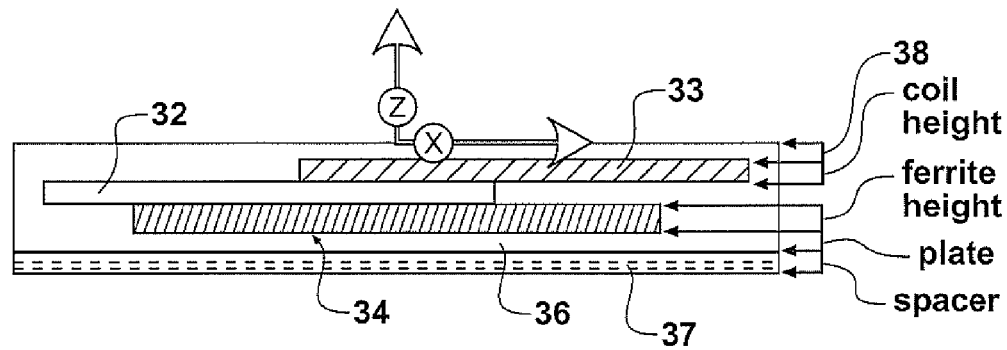
FIG. 17 illustrates a bipolar pad seen from the side (top) and from above (bottom)
Figure 17:
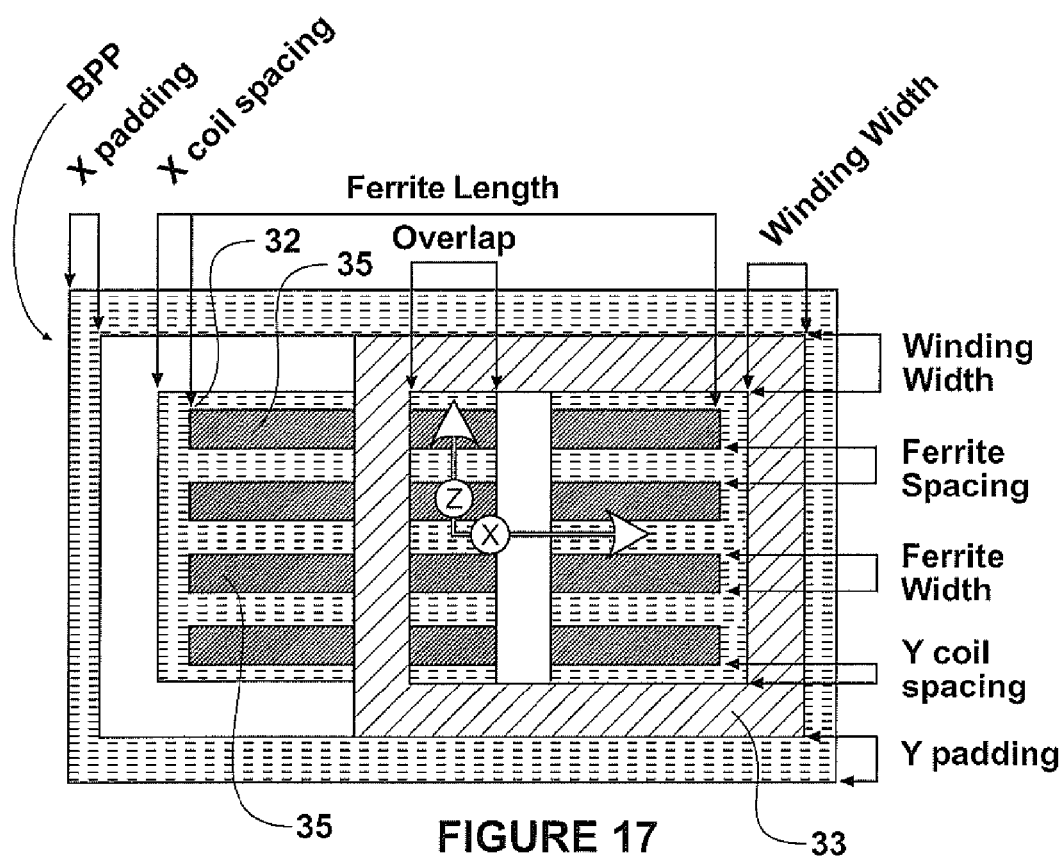

Prior to conducting any optimisation, some measurements of performance were made for the combinations referred to immediately above, and also for use of a further form of pad structure, referred to herein as a Bipolar pad which is shown in FIG. 17. In one embodiment the Bipolar pad consists, from bottom up, of an aluminium plate 37, a dielectric spacer 36, a core 34 comprising four rows of ferrite bars 35 (referred to herein as ferrites), two flat substantially coplanar, yet overlapping and ideally but not necessarily "rectangular" shaped coils 32, 33 (although in practice these are more oval due to the ease in winding Litz wire) spread out in the lateral direction, and a dielectric cover 38. The core 34 acts as a shield so that ideally all flux is channelled through the core 4 through the top of the pad. The plate 37 merely acts to a) eliminate and small stray or spurious fields that may be present above the core 34 in certain environments, and b) provide additional structural strength.

The magnetic structure of the Bipolar pad is designed so that there is substantially no mutual coupling between either of the coils 32, 33. This allows the coils to be tuned independently at any magnitude or phase without coupling voltage into each other. Each coil can be independently tuned and regulated without affecting the flux capture and power transfer of the other coil.

When the two primary coils 32, 33 of the Bipolar pad are placed with an arbitrary overlap with respect to each other, there will be a mutual coupling between the coils. However for a certain ratio of overlap to coil width, this mutual coupling is almost zero. The ideal overlap required to ensure no mutual coupling exists between each coil is not simple due the presence of the ferrite but can be determined by simply fixing one coil and energising this with a predetermined current at fixed frequency (either via a suitable 3D simulator or using a suitable experimental setup, for example). The open circuit voltage induced in the second primary coil can then be measured. If the second coil is moved so as to change the overlap there will be a change in coupled voltage. When this is minimised (ideally zero) the ideal configuration can be set.

This magnetic decoupling of coils 32 and 33 allows either of the coils to be independently tuned and rectified to the output without affecting each other. As such they can also be turned off (independently decoupled) using switches without affecting the flux capture of the other coil.

Figure 18:
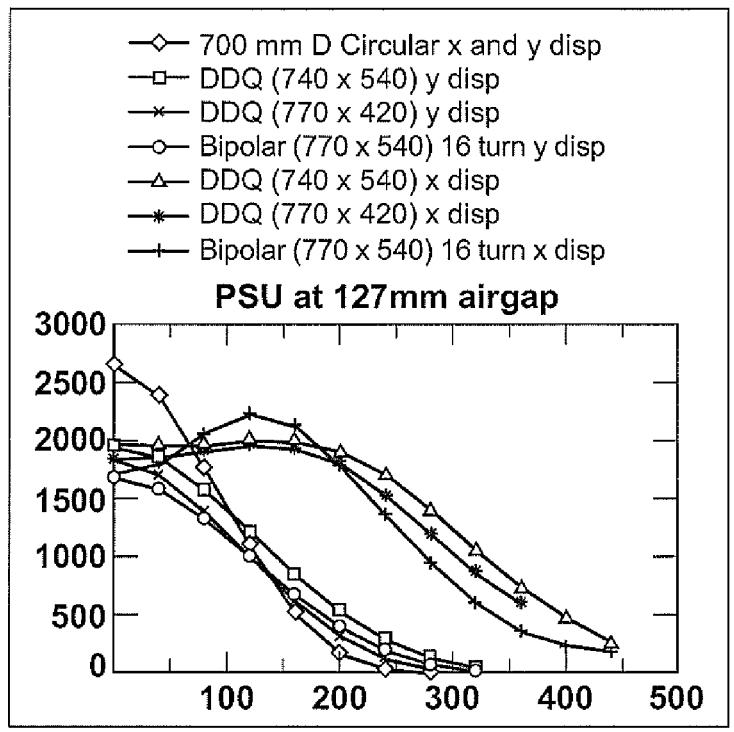
FIG. 18 shows the native VA coupled (Psu=Isc*Voc) with displacement for various pad combinations.
Figure 19:
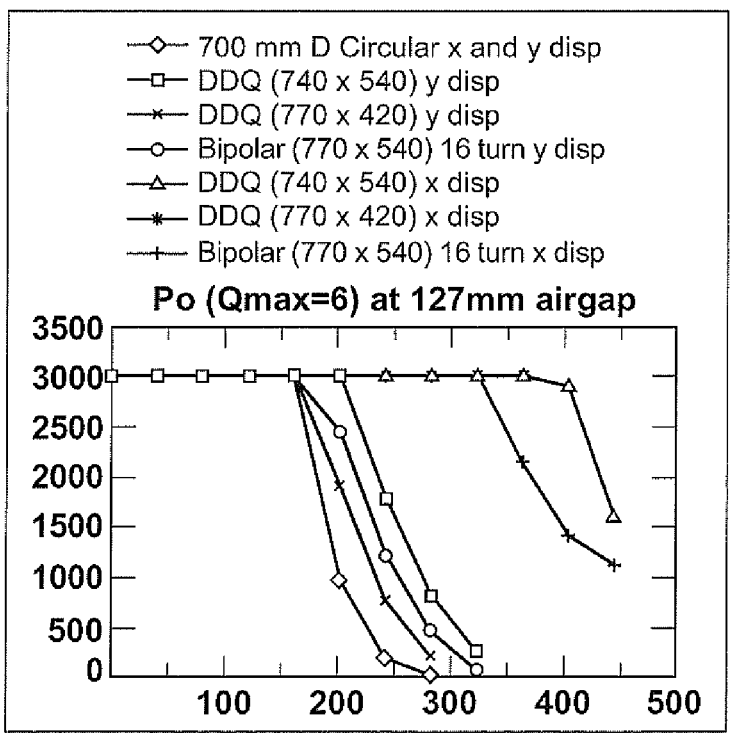
FIG. 19 shows the region over which it is possible to achieve 3 kW for the combinations of FIG. 18.
Figure 20:
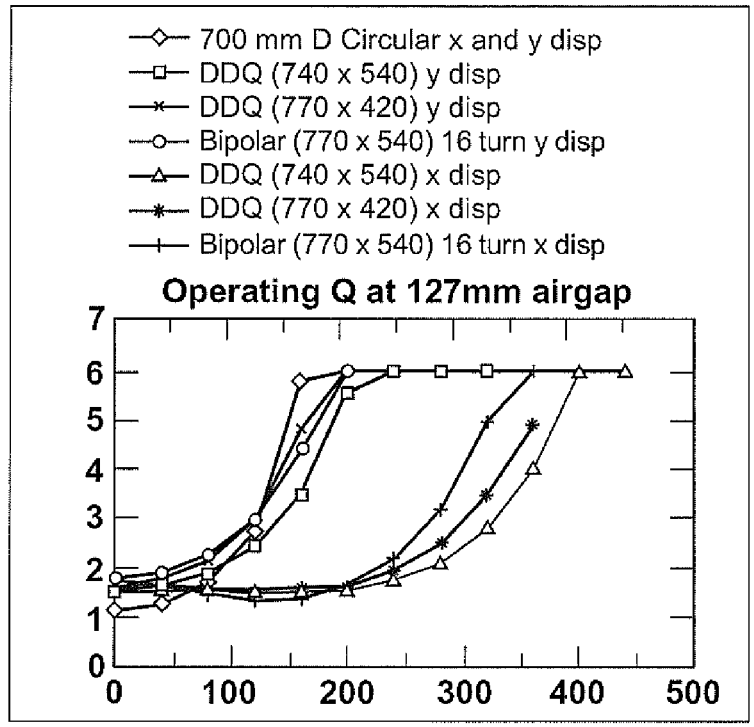
FIG. 20 shows the actual Q at which the pad operates to deliver the power for the combinations of FIG. 18.

FIGS. 18-20 show actual measurements of performance of each of circular, DDQ and Biploar pads as receivers for flux generated from a circular pad over a 700 mm diameter transmitter with 40 A in the pad. The assumed power requirement is 3 kW.

FIG. 18 shows the native VA coupled (Psu=Isc*Voc) with displacement. For all but the circular pad, measurements in y and x displacement (in mm) from centre are provided separately as the DDQ and Bipolar pads are polarized.

FIG. 19 shows the region over which it is possible to achieve 3 kW. In practice the actual power out is Po=Q*Psu. The operating Q of the pad is normally kept below 6, to ensure power can be delivered under uncertainties of tuning, operating frequency and also to ensure low loss.

The working VA of a pad is Q*P and the quality of the design coil ($Q_L$)=300. Worst case losses are VA/$Q_L$=6*3000/300=60 W (2%) at the extremes of maximum power and maximum Q.

If the Q is required to go above 6 it is assumed 3 kW cannot be delivered, and the power that can be delivered is shown.

FIG. 20 shows the actual Q at which the pad operates to deliver the power.

Note in all cases, the DDQ and Bipolar pads can deliver the power over a wider range than the circular. Here the circular pad can deliver full power in all directions with 160 mm displacement.

In the y direction (along the car) the smaller DDQ and Bipolar can also achieve this, and the larger DDQ to 180 mm, but will operate even with larger displacement. In the x direction (across the car), the DDQ and Bipolar pads will deliver full power over >320 mm (double the tolerance), and significant power beyond that.

Figure 14A:
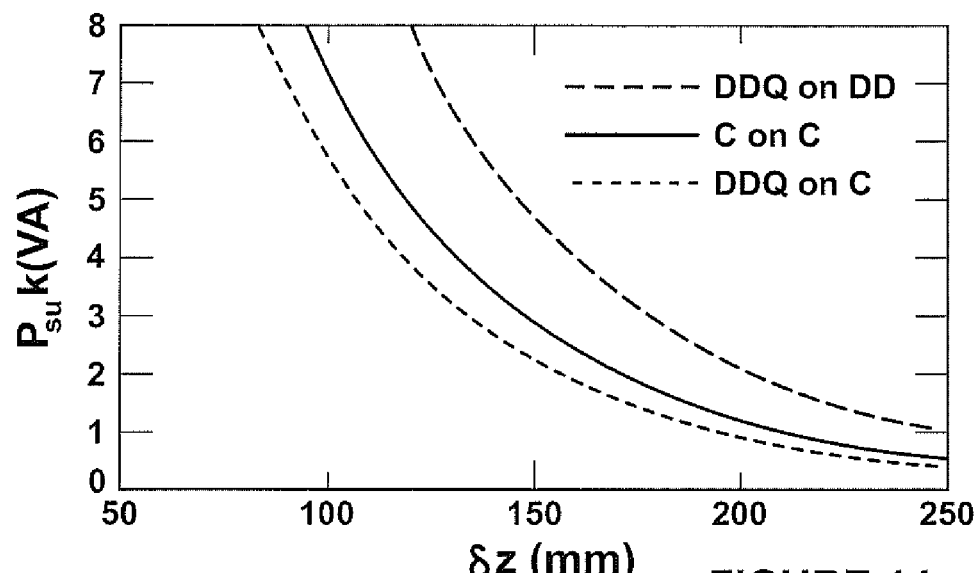
FIG. 14 shows vertical profiles for different pad combinations (a) $P_{su}$ and (b) k ($I_1$=23 A at 20 kHz)
Figure 14B:
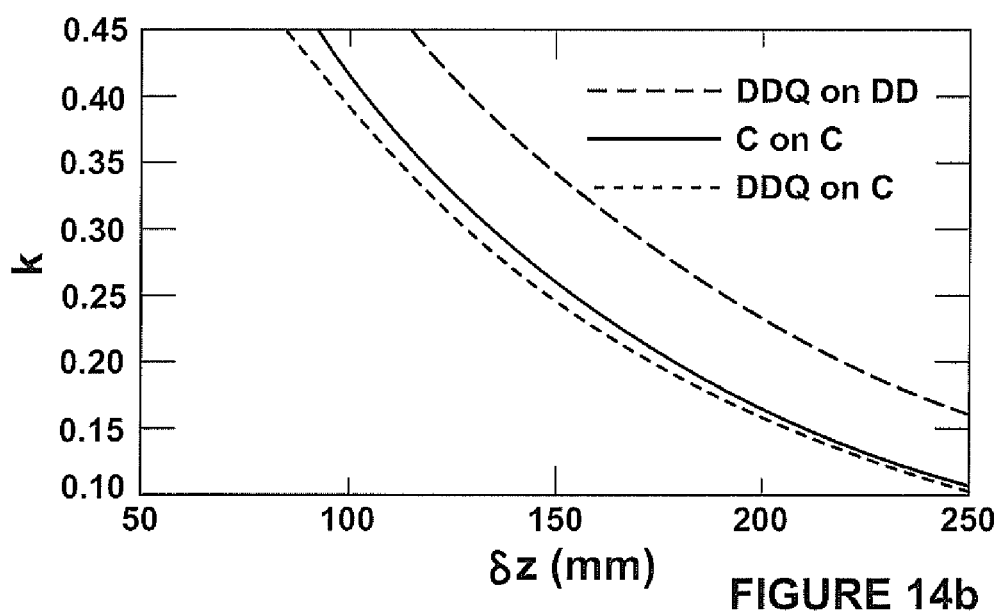
Figure 15:
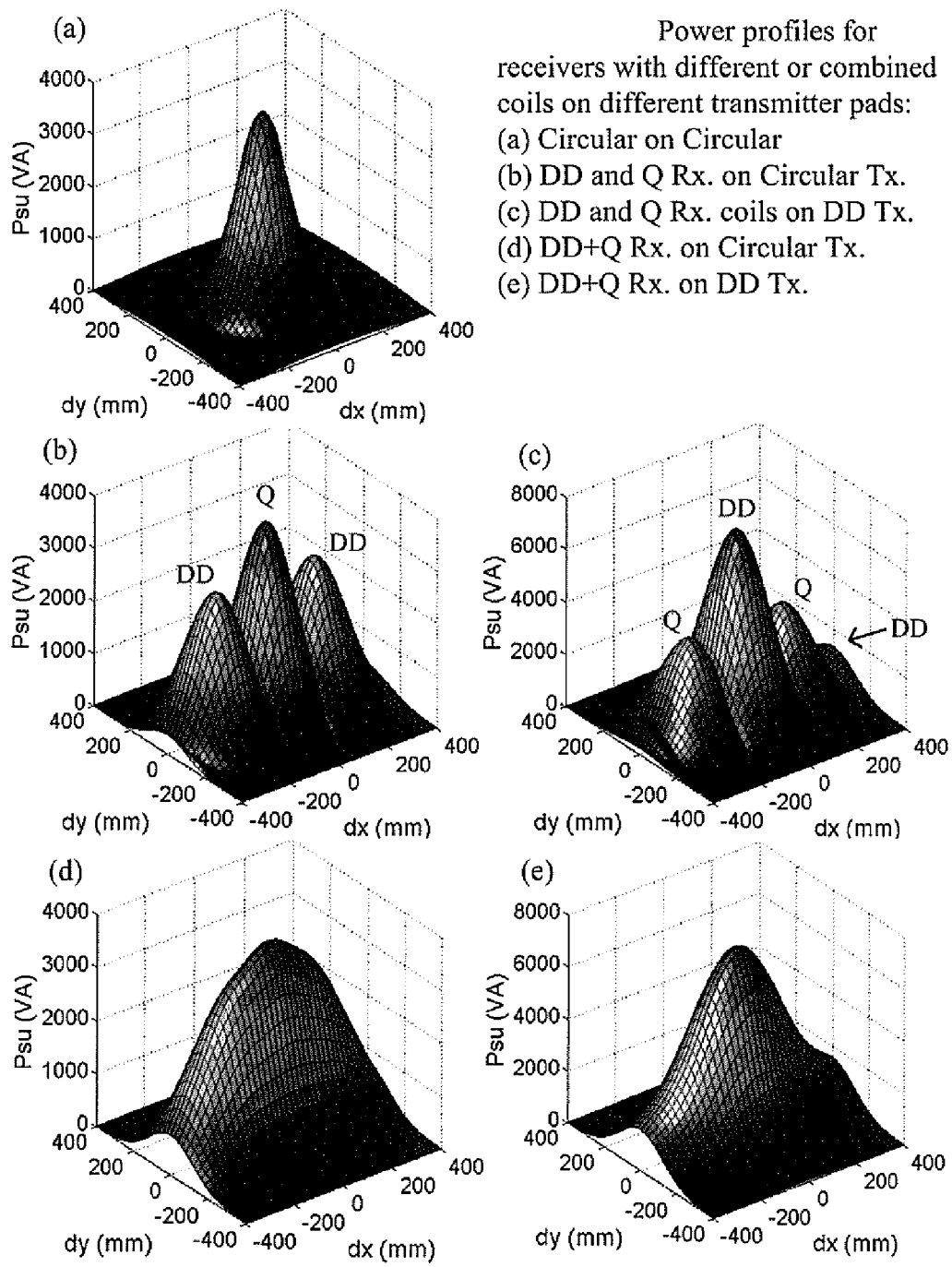
FIG. 15 shows power profiles for receiver pads with different or combined coils on different transmitter pads.

Results for optimised pad arrangements are now discussed with respect to FIGS. 14-16.

Vertical profiles $P_{su}$ and k for air gaps ranging from ~100 mm-250 mm are shown in FIGS. 14(a) and (b) respectively assuming the transmitter and receiver pads are perfectly aligned. The DDQ-DD combination offers significantly better power transfer than either of the other two. Although the DDQ receiver pad has not been specifically designed for operation with a circular transmitter yet is still achieves an almost identical performance noting the quadrature provides all of the output power when the DDQ is centered on the circular pad. The coupling is good because the coils are similar in size, the quadrature coil measures 450×391 mm and the circular transmitter is 416 mm. The power output of the DDQ is always close to that of a circular on circular design thus the pad is considered completely interoperable. If circular transmitter pads are present in a charging location, a car with a DDQ receiver can magnetically couple with this transmitter and if operating at the same tuned frequency can feasibly receive almost an identical full power charging rate as an EV with a circular coupler specifically designed to operate with that same transmitter pad.

Circular on circular systems are not polarized but if a polarized receiver is used the system becomes polarized and complete 3D power profiles are needed for full characterization. A significant number of simulations were undertaken to determine the $P_{su}$ profiles shown in FIG. 15 using 20 mm increments in all directions. The vertical air gap for all simulations is set to 125 mm and $I_1$ is 23 A at 20 kHz. The $P_{su}$ profiles of FIG. 15(a)-(e) are arranged such that the first column shows results for pads excited with a circular transmitter while the second column shows the DDQ receiver operating above a DD transmitter for comparison. FIG. 15(a) shows the profile for a circular on circular system and this clearly indicates the power null that is intrinsic to circular pads. All circular profiles pass through this null regardless of the $P_{su}$ when the pads are horizontally aligned and this imposes a fundamental tolerance limit that makes them less ideal for stationary charging without alignment means and unsuitable for RPEV.

The profile for a DDQ excited by a circular transmitter is shown in FIG. 15(b). The peak $P_{su}$ is similar to that achieved with a circular receiver (shown by FIG. 14(a)) however the horizontal tolerance in the x-axis is significantly better due to the contribution from the DD coils. The thickness of all the pads is the same however the surface area of the DDQ is 0.32 m² and the circular pad is 0.38 m². Given the overall material requirements for a DDQ are marginally greater than the circular, it would be preferable to have a DDQ receiver over a circular because of its far greater tolerance to horizontal misalignment. FIG. 15(c) shows the $P_{su}$ for the DD and Q coils separately when excited with a DD transmitter, the power output of the DD alone is significantly better than that possible using a circular transmitter. Here the quadrature coil contributes significantly to the overall output when the receiver is misaligned and comes up its maximum output as the DD enters its null. The annotated part of the surface where $\delta_x$ is large is the power output of the DD after it has passed through the null. The total of both the DD and quadrature outputs when excited by a circular transmitter (FIG. 15(d)) and the DD transmitter (FIG. 15(e)) are also shown for comparison. These combinations produce far greater charge zones than possible with circular receivers. The power profiles are both very smooth in the x-axis due to the balanced profiles of the individual coils shown in FIG. 15(b) or 9(c). These profiles demonstrate that the DDQ receiver offers significantly better performance compared to the circular on circular profile of FIG. 15(a).

Charge zones define the physical operating region where the desired power can be delivered given a particular air gap and operational Q. In this work a maximum Q of 6 was assumed and the air gap is set to 125 mm. The results of a DDQ receiver pad operating on DD transmitter can be compared with this same pad operating on circular pad in FIGS. 16(a) and (b) respectively. Both parts show the charge zone possible if a circular system were used for comparison. Notably the physically smaller DDQ-DD pads significantly outperform the circular pads. A DD alone provides a charge zone large enough to enable parking without electronic guidance. Either the quadrature or DD coil can be used to supply the full output power in the regions where the DD and quadrature charge zones overlap. The region outside the explicit DD and quadrature charge zones (indicated by DD+Q in FIG. 16(a)) shows the output of either coil is not enough to provide the desired 7 kW but when both coils are combined the power output is ≥7 kW. The small DD 'zones' when $\delta_x$ is very large show the DD has passed through its null and is able to supply the required 7 kW.

Figure 16B:
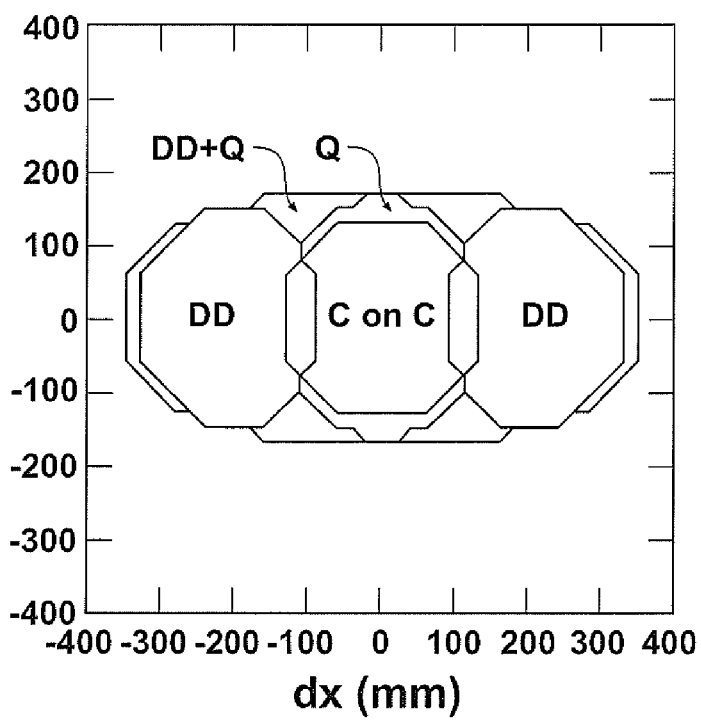

The DDQ-DD pads described herein are ideal for RPEV applications because the power zone is reasonably smooth in the y-axis. In practice the pads would need to be scaled in size to meet the 20-60 kW required for charging and propelling a vehicle. To illustrate the concept however, the DD pads can be placed along a road orientated so the width of the pad (shown in FIG. 12) is in the direction of travel (along the y-axis). The DDs investigated here are only 410 mm wide and 7 kW can easily be transferred when the DDQ receiver is offset by 205 mm in the y-axis. At this point the DDQ receiver is also effectively offset from an adjacent transmitter by 205 mm in the y-axis therefore continuous power could be provided to the EV. Note at that point the power is likely to be significantly greater than 7 kW due to the contribution from both pads thus permitting the transmitter pads to be positioned in the road with a gap between them. This will lower the cost of an RPEV system given fewer pads are needed per km of road regardless of size. Determining the ideal pad pitch requires a significant optimization process and is beyond the scope of this paper. The charge zone for a DDQ on a circular pad is shown in FIG. 16(b)—this is a far larger zone than that possible with circular pads only. The DDQ receiver is considered to be completely interoperable with systems based on circular pads and as shown an EV will fundamentally have more tolerance.

The present invention provides a new polarized coupler (the DDQ) which produces a flux path height twice that of a circular pad while also having a single sided flux path. The DD transmitter produces a continuous flux path and is ideal for RPEV propulsion and charging. The DDQ pad is also completely interoperable with traditional circular pads and actually offers far greater tolerance than a circular receiver. As shown, the new DD pad topology makes IPT EV charging significantly more cost effective than conventional designs.

In contrast, existing pads constrain the flux paths. Consider the bipolar pad of FIG. 17. Here the ferrite back plane has bars 25 in a similar manner to the DD transmitter of FIG. 11. These ferrite strips are suited to capturing polarized fields extending from the north and south poles, however when placed over a circular transmitter, field lines are required to extend in various directions to better couple to the transmitter, but in the receiver these field lines must enter and exit each ferrite strip at right angles, and this increases the reluctance of the path.

Figure 21:
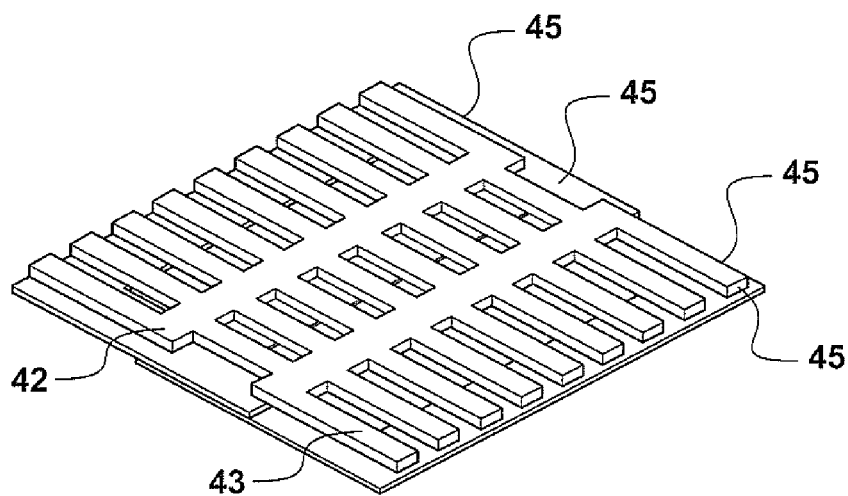
FIG. 21 shows a Bipolar pad with modified core or back plane using interconnecting ferrite blocks that form a lattice to allow better flux capture from a circular transmitter pad.

Now referring to FIG. 21, a new ferrite back structure is proposed which includes strips 45 of overlapping ferrite segments that provides a low reluctance pathway in all directions suitable for both transmitter types. As shown in FIG. 22 this can be evaluated against the normal construction and variations of this structure where the back plane is reduced relative to the size of the coils and the results are shown in FIGS. 23 and 24. Later comparisons are made with the backplane kept constant and with coil reduction.

The comparison is made with a primary circular pad constructed to have a total pad diameter of 420 mm, having a coil inner diameter of 190 mm, coil outer diameter of 286 mm, 8 ferrite spokes, each of length 118 mm. This primary is energized with a 20 A rms current at 20 kHz. The distance between the transmitter and receiver pad (z offset) is maintained at 40 mm for all systems tested, while each of the bipolar receivers under evaluation are moved laterally in the x and y directions (as per the definitions for movement defined in FIG. 11). When the receiver is perfectly centered on the transmitter the x, y, z dimensions in mm are 0,0,40. The bipolar structures have a maximum dimension of 300× 300 mm. The outer dimension of the coils are 280 mm×280 mm., and are each made of 5 turns of 4 mm diameter wide Litz, bifilar wound (as such they are 40 mm wide). Actual coil dimensions are based on overlap between the two coils. In this original model the ferrite structure shows three ferrite strips made up of three standard ferrite bars each with dimensions 93 mm long×28 mm wide×16 mm deep. This provides a low reluctance path to fields extending along the x direction as is expected if the transmitter is a DD structure.

In later models the ferrite structure uses smaller ferrite bars each 110 mm long×15 wide×8 mm deep which are overlapped to allow ferrite extensions in both the x and y directions to evaluate any improvement to providing a low reluctance path to the fields to both the x and y directions, given a circular transmitter will have fields extending outwards from its centre in all directions. The length of the overall length of the ferrite structure is 280 mm long and width is determined by the number of ferrite bars chosen. The depth of the ferrite bars normally is important if there are concerns about saturation. In the investigated case the ferrite is never close to saturation and therefore what is more important here are the variations shown in the width and length of the bars. As noted the overall length of the ferrite structure in all cases is similar but the width varies between the evaluated systems.

In the structure called P1 (FIG. 22), 26 ferrite blocks are used and placed under similar sized coils to the original model (except for the overlap, which is determined for each new model to ensure no mutual coupling between the two receiver coils). The ferrite structure is identical in the second model called P1-CS, which is different only because it uses smaller coils (whose outer dimensions are reduced by 10 mm to expose 10 mm of ferrite on the x and y faces of the receiver pad to encourage flux capture). The final structure called P2 has 16 ferrite blocks and similar coils to that of P1 except for the overlap required to ensure no mutual coupling.

FIGS. 23 and 24 compare the simulated operation of the original model against P1 and P2. In FIG. 23 the impact of moving the receiver in the x direction relative to the circular transmitter is shown, while in FIG. 24 movements in the y direction are considered. As noted, all three models have essentially identical coil sizes in the receiver (except for small differences in overlap to ensure no mutual coupling).

As shown, there is slight asymmetry in the results, and this arises because coil 43 on the bipolar receiver is simulated to be spaced further away from the ferrite strips and therefore closer to the circular transmitter than coil 42. As such, when the receiver is displaced to the left of centre alignment coil 43 is found to couple more power. It should be noted that V1 and V2, and I1 and I2 in FIGS. 23 and 24 relate to the voltage and current in coil 42 and coil 43 respectively for the bipolar pad. When considering the presented results, notably a larger ferrite structure is beneficial particularly in terms of coupled voltage and over all uncompensated power transferred. In the original model three bars 28 mm wide are available to capture flux at the ends (in total 84 mm). In the ferrite structure labeled P1, 9 thinner bars each 15 mm wide (135 mm in total) capture flux at the ends over a wider area, while in the ferrite structure P2 5 thinner bars each 15 mm wide (in total 75 mm) capture over a smaller area. As noted, with a wider area of flux capture the coupled voltage increases (when comparing P1 over either the original design with bars or P2), particularly in the centre region, however the captured flux drops more rapidly with displacement more than 200 mm in the x direction and 100 mm in the y direction. The total available uncompensated power in the centre is significantly increased by 43% for P1 over P2 and by 26% with P1 over the original bar design. Considering the working range of such a small receiver is typically considered to be within x displacements of +/−150 mm and y displacement of +/−100 mm, this is significant.

When considering FIGS. 25 and 26, here two designs are compared with identical ferrite structures, but with bipolar coils which are varied in size. As shown, in the design labeled "P1-CS" which represented ferrite structure in P1 with coils which have been reduced in size to expose additional flux at the extremes for flux capture. When each of the coils are centered over the transmitter the actual voltage is slightly reduced due to the smaller coil area, however when offset slightly these voltages are similar, in contrast the currents remain largely unaffected within +/−100 mm offset and generally increase (particularly when the bipolar receiver is centered on the transmitter) indicating an improved coupling when aligned and an uncompensated power increase of 10%.

A desirable aspect is to ensure improved coupling with tolerance. As such, larger coils and a ferrite back plane which can capture flux in all directions is likely to be preferable.

Thus FIGS. 27 and 28 show possible structures which would be suitable for both a Bipolar and DDQ receiver to ensure they are interoperable for both polarized and circular structures. The additional ferrite interconnecting blocks 47 that interconnect bars 45 at selected locations enable additional pathways or regions of low reluctance (i.e. transverse pathways and pathways at angles between longitudinal and transverse directions) for flux when the receiver is displaced laterally from a circular transmitter, while the ferrite strips are best for polarized transmitters. Thus a lattice core structure is provided.

In FIG. 28, the two side by side double D coils are referenced 48, and the overlapping quadrature (Q) coils is referenced 49.

Those skilled in the art will appreciate that the structures described above may be used bi-directionally. Therefore, although the circular pad structure has been described by way of example as a flux transmitter, the systems may be reversed so that the circular structure is used as a receiver. Furthermore, the new core structures described may be used on flux generating arrangements.

It should be noted that various changes and modifications to the presently preferred embodiments described herein will be apparent to those skilled in the art. Such changes and modifications may be made without departing from the spirit and scope of the invention and without diminishing its attendant advantages. It is therefore intended that such changes and modifications be included within the present invention.

The invention claimed is:

1. A loosely coupled inductive power transfer apparatus, the apparatus comprising:
    a first magnetic coupling structure arranged in a plane and
        a primary coil having at least one turn and arranged in a plane substantially parallel to the plane of the ferrite structure, the coil configured to generate a magnetic flux;
    a second magnetic coupling structure comprising a first coil arranged to be responsive to a component of the magnetic flux from the first magnetic coupling structure that is perpendicular to the plane of the primary coil and a second coil arranged to be responsive to a component of the magnetic flux from the first magnetic coupling structure that is parallel to the plane of the primary coil; and
    an electrical circuit configured to sum and regulate outputs from the first and second coils to provide a required power profile over a range of relative transverse movement between the first and second magnetic coupling structures.

2. The apparatus as claimed in claim 1 wherein the coils of the second magnetic structure are arranged to provide coupling tolerance to relative transverse movement between the first and second structures.

3. The apparatus as claimed in claim 1 wherein the coils of the second structure extract electrical energy from the magnetic field produced by the first structure in differing amounts as the relative transverse position of the structures differs.

4. The apparatus as claimed in claim 1 wherein one of the coils of the second structure receives a greater proportion of a first directional component of a magnetic field produced by the first structure, and another of the coils of the second structure receives a greater proportion of a second directional component of the magnetic field produced by the first structure.

5. The apparatus as claimed in claim 4 wherein the components of the magnetic flux are in quadrature.

6. The apparatus as claimed in claim 1 wherein the coils of the second structure are flat coils.

7. The apparatus as claimed in claim 1 wherein the coil of the first structure is a flat coil.

8. The apparatus as claimed in claim 1 wherein two coils of the second structure are in a side by side relationship.

9. The apparatus as claimed in claim 8 wherein the second structure includes a third coil arranged in spatial quadrature with the at least two coils.

10. The apparatus as claimed in claim 1 wherein the second structure includes two coils which overlap each other.

11. The apparatus as claimed in claim 1 wherein the core of the second structure has regions of greater and lesser magnetic reluctance.

12. The apparatus as claimed in claim 1 wherein the core of the second structure comprises a lattice.

13. An inductive power transfer system including the apparatus of claim 1.

14. The apparatus as claimed in claim 1 wherein the coils of the second structure are associated with a magnetically permeable core.

15. The apparatus as claimed in claim 1 wherein the coils of the first magnetic coupling structure is substantially circular.

16. A method of inductively transferring power, the method comprising:
generating magnetic flux via a first magnetic coupling structure comprising a first magnetic coupling structure comprising a ferrite structure arranged in a plane and a primary coil having at least one turn and arranged in a plane substantially parallel to the plane of the ferrite structure;
receiving magnetic flux via a first coil of a second magnetic coupling structure, the first coil arranged to be responsive to a component of the magnetic flux from the first magnetic coupling structure that is perpendicular to the plane of the primary coil;
receiving magnetic flux via a second coil of the second magnetic coupling structure, the second coil arranged to be responsive to a component of the magnetic flux from the first magnetic coupling structure that is parallel to the plane of the primary coil; and
summing and regulating output from the first and second coils to provide a required electrical circuit configured to sum and regulate outputs from the first and second coils to provide a required power profile over a range of relative transverse movement between the first and second magnetic coupling structures.

17. The method as claimed in claim 16 further comprising receiving magnetic flux via a third coil of the second magnetic coupling structure, the third coil being arranged to be responsive to a vertical component of the magnetic flux.

18. The method as claimed in claim 16 further comprising receiving magnetic flux via a third coil of the second magnetic coupling structure, the third coil being arranged to be responsive to a horizontal component of the magnetic flux.

* * * * *